United States Patent [19]

Wilke

[11] Patent Number: 5,267,182

[45] Date of Patent: Nov. 30, 1993

[54] DIOPHANTINE SYNTHESIZER

[76] Inventor: William G. Wilke, 24 Prescott St., Arlington, Mass. 02174

[21] Appl. No.: 815,698

[22] Filed: Dec. 31, 1991

[51] Int. Cl.$^5$ ............................................... G06F 7/68
[52] U.S. Cl. ................................................... 364/703
[58] Field of Search .................. 364/703, 718, 715.01; 328/14

[56] References Cited

U.S. PATENT DOCUMENTS

| | | | |
|---|---|---|---|
| 3,895,312 | 7/1975 | Tipon | 331/18 |
| 3,906,388 | 9/1975 | Jones et al. | 331/39 |
| 3,956,703 | 5/1976 | Noordanus et al. | 328/14 |
| 4,322,692 | 3/1982 | Brewerton | 331/2 |
| 4,425,552 | 1/1984 | Sterling | 331/39 |
| 4,464,638 | 8/1984 | Crowley | 331/1 |
| 4,516,084 | 5/1985 | Crowley | 331/2 |
| 4,528,522 | 7/1985 | Matsuura | 331/2 |
| 4,763,083 | 8/1988 | Edwards | 331/2 |
| 4,859,968 | 8/1989 | Gershon | 331/38 |
| 4,940,950 | 7/1990 | Helfrick | 331/2 |
| 4,963,838 | 10/1990 | Hareyama | 331/2 |
| 4,994,762 | 2/1991 | Tay | 331/2 |

*Primary Examiner*—Long T. Nguyen

[57] ABSTRACT

A frequency synthesizer with at least two main Phase Locked Loops (PLLs) and a signal combiner, where each PLL's input is driven by a reference source of frequency $F_{ref}$, and each PLL has programmable dividers in both its input path (M and P) and its feedback path (N and Q). The synthesizer utilizes a method to produce an output frequency $F_{out}$ that is a close approximation to a requested frequency $F_{req}$. The method includes making a series of rational fraction approximations $X_i/Y_i$ to the ratio $F_{req}/F_{ref}$, factoring the resulting $Y_i$'s into several factors $M_i$ and $P_i$, picking a pair $X_k$, $Y_k$ that is a good approximation, but where neither $M_k$ nor $P_k$ is too large for the dividers, and then using diophantine calculation methods and a further equation relating to the way the PLL's signals are combined, to calculate $N_k$ and $Q_k$. The integers $M_k$, $N_k$, $P_k$, and $Q_k$ are then used to program the four dividers. Several forms of the invention further use a controlled reference source, and by varying $F_{ref}$, allow more than one approximation to be made, and the error for each to be determined. After several such calculations, a low error one is chosen, and its $M_i$, $N_i$, $P_i$ and $Q_i$ values used. The invention works with synthesizers where the PLL's signals are combined to produce $F_{out}$, and with synthesizers where the combined signal is used as a feedback signal for the PLL's.

25 Claims, 15 Drawing Sheets

| I | T | X | E | Y | F | A | B | X/Y*10 |
|---|---|---|---|---|---|---|---|---|
| 0 | 6 | 1 | 0 | 0 | 1 | 6,045,204 | 1,000,000 |  |
| 1 | 22 | 6 | 1 | 1 | 0 | 45,204 | 1,000,000 | 60.000000 |
| 2 | 8 | 133 | 6 | 22 | 1 | 5512 | 45204 | 60.454545 |
| 3 | 4 | 1070 | 133 | 177 | 22 | 1108 | 5512 | 60.4519774 |
| 4 | 1 | 4413 | 1070 | 730 | 177 | 1080 | 1108 | 60.4520548 |
| 5 | 38 | 5483 | 4413 | 907 | 730 | 28 | 1080 | 60.4520397 |
| 6 | 212767 | 5483 | 35196 | 907 | 16 | 28 | 60.452040 |

FIG. 8

| i | T | $X_i$ | E | $Y_i$ | A | B | err/$F_{req}$ | FACTORS |
|---|---|---|---|---|---|---|---|---|
| 1 | 0 | 1 | 0 | 0 | 2526728791 0400 | | | |
| 2 | 65 | 65 | 1 | 1 | 2965524 26534 | 38416516 1290 | $1 \times 10^{-2}$ | |
| 3 | 1 | 66 | 65 | 1 | 87612734756 | 38416516 1290 | $3 \times 10^{-3}$ | |
| 4 | 3 | 263 | 66 | 4 | 33714222267 | 29655242 6534 | $3 \times 10^{-4}$ | |
| 5 | 2 | 592 | 263 | 9 | 20184290222 | 87612734756 | $9 \times 10^{-5}$ | |
| 6 | 1 | 855 | 592 | 13 | 13529932045 | 33714222 2267 | $4 \times 10^{-5}$ | |
| 7 | 1 | 1447 | 855 | 22 | 6654358177 | 20184290222 | $1 \times 10^{-5}$ | |
| 8 | 2 | 3749 | 1447 | 57 | 221215690 | 13529932045 | $2 \times 10^{-7}$ | |
| 9 | 30 | 113917 | 3749 | 1732 | 17887471 | 6654358177 | $4 \times 10^{-10}$ | $4*433$ |
| 10 | 12 | 1370753 | 113917 | 20841 | 6566037 | 221215690 | $1 \times 10^{-11}$ | $3*6947$ |
| 11 | 2 | 2855423 | 1370753 | 43414 | 4755397 | 17887471 | $4 \times 10^{-12}$ | $49*866$ |
| 12 | 1 | 4226176 | 2855423 | 64255 | 1810640 | 6566037 | $1 \times 10^{-12}$ | $1*64255$ |
| 13 | 2 | 11307775 | 4226176 | 171924 | 1134117 | 4755397 1810640 | $3 \times 10^{-13}$ | $4*42981$ |

*FIG. 9A*

| k | T' | X' | E' | Y' | F' | A' | B' |
|---|----|----|----|----|----|----|----|
| 0 | 0  | 1  | 0  | 0  | 0  | 886| 49 |
| 1 | 18 | 18 | 1  | 1  | 0  | 4  | 49 |
| 2 | 12 | 217| 18 | 12 | 1  | 1  | 4  |
| 3 | 4  | 886| 217| 49 | 12 | 0  | 1  |

*FIG. 9B*

| | |
|---|---|
| $AA/M_i > BB/P_i$ | $AA/M_i < BB/P_i$ |
| $F_{out}/F_{refj} = AA/M_i - BB/P_i$ | $F_{out}/F_{refj} = -AA/M_i + BB/P_i$ |
| | $= BB/P_i - AA/M_i$ | in both cases, let u = int{ smaller }, so:

| | |
|---|---|
| $u = int\{ BB/P_i \}$ | $u = int\{ AA/M_i \}$ |
| $F_{out}/F_{refj} = (AA/M_i - u) - (BB/P_i - u)$ | $F_{out}/F_{refj} = (BB/P_i - u) - (AA/M_i - u)$ |
| $= (AA - M_i{}^*u)/M_i - (BB - P_i{}^*u)/P_i$ | $= (BB - P_i{}^*u)/P_i - (AA - M_i{}^*u)/M_i$ |
| $= CC/M_i - DD/P_i$  where: | $= CC/P_i - DD/M_i$  where: |
| $CC = AA - M_i{}^*u$ | $CC = BB - P_i{}^*u$ |
| $DD = BB - P_i{}^*u$ | $DD = AA - M_i{}^*u$ |

FIG. 10A

$u = int\{ BB/P_i \}$ $= int \{ 34,265,076 / 49 \}$ $= 699,287$ $CC = AA - M_i{}^*u$ $= 619,626,791 - 886 * 699,287$ $= 58509$  and $DD = BB - P_i{}^*u$ $= 34,265,076 - 49 * 699,287$ $= 13$ so:  $F_{out}/F_{ref} = CC/M_i - DD/P_i$ $= 58509 / 886 - 13 / 49$

FIG. 10B

DIOPHANTINE SYNTHESIZER

BACKGROUND OF THE INVENTION

1. Field of the Invention

This invention relates generally to frequency synthesizers and more particularly to such a synthesizer which is capable of fast switching times, good noise suppression, and extremely high resolution in frequency.

2. Cross Reference to Related Applications

The inventor's application (Ser. No. 07/769,093 Rational Fraction Synthesizer), submitted on Sep. 30, 1991, and the inventor's U.S. Pat. No. 5,144,254 dated Sep. 1, 1992, are incorporated herein by reference.

3. Description of the Prior Art

The frequency synthesizer is a well known and widely used electronic subsystem. Basically, frequency synthesis involves two distinct approaches, sometimes referred to as direct synthesis and indirect synthesis. All such synthesizers utilize a source of reference frequency, such as a quartz oscillator, or atomic standard, or some other highly accurate, fixed frequency reference. The source frequency itself is then operated on to provide a wide band of frequencies, each possessing the stability or accuracy of the source. In the direct synthesis approach, the designer may employ dividers, multipliers and such devices which operate on the frequency standard to derive the required output range of frequencies.

In the indirect approach, a VCO or controllable oscillator or other tunable source is used as a generator of the frequency range desired and this is then locked to the source by means of a frequency locked or phase locked loop. Thus one need not utilize complicated filtering schemes as necessary in the direct synthesis approach.

While the frequency synthesizer is characterized above as a separate test instrument, the techniques have found widespread use in the communications field as a local oscillator for a radio receiver or transmitter. A good description of some representative synthesizer techniques appear in books such as *Digital PLL Frequency Synthesizers* by Ulrich L. Rohde (1983); *Frequency Synthesizers; Theory and Design* 3$^{rd}$ Ed. by Vadim Manassewitsch; and *Microwave Frequency Synthesizers* by Ronald C. Sterling.

A commonly used prior art frequency synthesizer is the conventional divide-by-N phase locked loop (PLL) design that generates frequencies which are multiplers of a comparison frequency. More specifically, such a frequency synthesizer consists of a voltage (or current) controlled oscillator (VCO), divide-by-N logic which divides the output frequency of the VCO by N to produce a signal of frequency $F_C$, and a phase (and/or frequency) detector which receives the divided signal at one input thereof and the reference frequency signal of frequency $F_{ref}$ at the other input thereof. The output of the phase detector is supplied back to the frequency control input of the VCO through a loop filter so that the output frequency of the VCO, after being divided by N, is equal to the frequency of the reference signal. By changing the value of N, $F_{out}$ can be changed in frequency steps equal to $F_{ref}$.

The prior art also includes the ability to divide a reference signal by M before it is input to the phase detector at a comparison frequency $F_C$. This is done because the best frequencies for building good reference clocks (e.g.: 3 to 5 MHz for crystals) are often not the desired frequencies for comparison $F_C$. Thus an M divider is often used to divide down from the best $F_{ref}$ frequency to the chosen $F_C$, but the divider is fixed at one value—or occasionally two, when two different $F_C$'s are to be provided. Thus even if the prior art apparatus allowed M to be programmed, said programming was done just once, and not updated for each new requested $F_{out}$. To improve the frequency resolution of such prior art synthesizers, the designer must decrease $F_C$, but many important characteristics such as speed of lock, noise rejection (especially microphonics), $F_C$ rejection, and so on limit the amount by which $F_C$ can be reduced. A similar tradeoff exists even in the present invention, but the teaching of this invention makes the tradeoff much less strict.

Other prior art combines a single PLL and a variable timebase. This combination may take any of several forms. First, a single PLL may be driven by a direct digital synthesizer (DDS) subsystem used as a variable timebase, wherein the PLL becomes a "course" loop, while the DDS forms a "fine" source. The DDS is called on to "fill in the steps" between the "course" steps of the PLL. Such art has become more popular, but it still is expensive and still has inherent noise problems. Another version uses a PLL driven by a variable clock consisting of a crystal oscillator that is "pulled" by a small amount, again to effectively fill in between the "course" steps of the final loop. Though this latter technique is less expensive and does not have the noise problems of the DDS technique, it does have at least three problems of its own: First, the output is now based not on a high quality stable source, but rather on a "pulled" crystal, so overall accuracy and stability are compromised. Second, an "external timebase in" cannot be used, because the "pulled" crystal is not locked to anything. Third, an "internal timebase out" cannot be provided, because none exists; the "pulled" crystal signal is of little value to a user, because it is not constant or at a "standard" frequency. And even if a user just used it relative to the overall synthesizers output, said overall output would then fall back to only having "course" resolution relative to the (variable) timebase out.

Another characteristic of prior art variable clocks, is that they must be designed to have their step size approximately constant, whereby the gaps between the "course" steps can be filled in evenly. The "steps" of the present inventions adjustable timebase are not required to be even, as will be described below.

Synthesizers that use two phase-locked loops responsive to the same reference signal, and where the outputs of the two PLL's are combined to form $F_{out}$ (typically using a mixer and filters, to effectively "add" or "subtract" the two frequencies), are known in the art. Such synthesizers where the combined signal is instead used in the feedback path of one of the PLL's, are also known in the art. The prior art, however, does not generally program all four of the division numbers, nor re-program all four for each new requested frequency. Nor does this prior art have a calculation means with a calculation procedure for finding the best integer values for the programmable divisions. Also, the final resolution of such prior art combined PLL schemes, is typically that of one of the PLL's. Said prior art would often identify one loop as "course" and the other as "fine", but would again end up with the overall resolution equal to the comparison frequency $F_C$ of one of the loops (the "fine").

Other prior art (this inventors application Ser. No. 07/769,093, entitled "Rational Fraction Synthesizer") teaches a synthesizer wherein the final resolution is better—often much better—than $F_C$, and one could imagine two such prior art synthesizers having their outputs combined through addition and subtraction. Though several advantages might accrue from such a combination, its final resolution would still only be that of the better of the two. The present invention, by calculating division numbers for both PLL's at the same time, can provide a synthesizer that synergistically combines the calculations for the two PLL's, and wherein the combined resolution is considerably better than the resolution of either PLL separately.

Further prior art (this inventors U.S. Pat. No. 5,144,254 entitled "Dual Synthesizer") teaches the use of two PLLs, connected essentially in series, and a method for producing $F_{out}$ therewith. Said art can, in its dual-factor embodiment, approach frequency resolution similar to that provided by the present invention, but only under the condition that the former can, for each $F_{req}$, successfully factor two different numbers ($Y_i$ and $X_i$), versus the present inventions considerably relaxed requirement that it be able to successfully factor only one number ($Y_i$).

OBJECTS AND SUMMARY OF THE INVENTION

An object of the invention is to provide a low cost synthesizer that produces a low noise, high resolution signal over a wide frequency range.

Another object of the invention is to provide a synthesizer with resolution better than that of conventional two-loop synthesizers.

Yet another object of the invention is to provide a method whereby a synthesizer with a main oscillator whose output is mixed down before it is used in the feedback loop, can achieve higher resolution than provided by prior art mixing techniques.

A further object of the invention is to provide a method whereby a synthesizer with a first oscillator whose output is combined (added or subtracted) with a second oscillator, and said combination used as the output, can produce a better frequency resolution with a higher comparison frequency $F_C$ than prior art.

Still another object of the invention is to provide a high resolution approximation synthesizer requiring only a single successful factoring, saving time over art requiring two successful factorings.

A further object of the invention is to provide a synthesizer with a timebase of a standard frequency, to allow that timebase signal to be brought out to the user, and/or to allow the synthesizer to use an external reference at the said standard frequency or at a simply related frequency as the main timebase.

Another object of the invention is to provide a method to improve the frequency resolution of synthesizers with two main PLL's with combined feedback or combined output, even when further operations such as down-conversion, dividing, and multiplying are performed on the signals of one or both of said two main PLL's before said combining or on said combined signal after combining.

In accordance with an aspect of the present invention, there is provided, in a frequency synthesizer comprising at least two main PLLs, where each PLL has programmable dividers in both its input path (M and P) and its feedback path (N and Q), and where the PLLs are responsive to a reference source of frequency $F_{ref}$, and each of the four programmable counters is controlled by a calculation and control means, a method to produce an output frequency $F_{out}$ that is a close approximation to a requested frequency $F_{req}$, by receiving $F_{req}$, doing several calculations to arrive at integer values for N,M,Q, and P, loading them into the appropriate programmable counters, generating several signals, and dividing them by said integers, locking said loops, and thereby producing said approximate signal $F_{out}$. The calculations include making a plurality of rational fraction approximations $X_i/Y_i$ to the ratio $F_{req}/F_{ref}$, factoring $Y_i$ into at least two factors $M_i$ and $P_i$, picking an $X_k,Y_k$ pair that is a good approximation, but where neither $M_k$ nor $P_k$ is too large, and then using diophantine solution methods to solve for intermediate integers AA and BB that solve $X_k = AA*P_k + -BB*M_k$ and finally calculating $N_k$ and $Q_k$ from AA and BB, by the use of a further constraint equation—typically relating to some hardware characteristic of the apparatus of the synthesizer. $M_i,N_i,P_i$, and $Q_i$ (or further manipulated versions thereof) are then used to program the four programmable counters in the two PLLs. Several forms of the present invention further comprise a variable reference source, of frequency $F_{refj}$, as indicated schematically in FIG. 1B versus FIG. 1A. With several $F_{refj}$ values available, several different approximations can be made, and one of the better ones (e.g.: where $F_{out} - F_{req}$ is smaller than some error limit) can be chosen, and the corresponding $M_i,N_i,P_i$ and $Q_i$'s used to program the counters.

In accordance with one preferred form of the invention, the combined signal is used to directly or indirectly produce the output $F_{out}$. In accord with a second form of the invention, the combined signal is used directly or indirectly to provide the feedback signal to one (or more) of the PLLs. In either case, the design equation is of a form comprising a sum or difference of rational fractions. In the case of two main PLLs, it will look like: $F_{out} = A*(B/C + -D/E)*F_{ref} + -G$, and the teaching of the present invention allows producing an $F_{out}$ signal with very high frequency resolution.

The forgoing as well as other objects, features and advantages of the present invention will be apparent from the following, more particular description of the preferred embodiments of the invention, as illustrated in the accompanying drawings.

BRIEF DESCRIPTION OF THE DRAWINGS

FIG. 8 is a table illustrating a sample calculation according to the procedure of FIG. 7.

FIG. 9A is a sample calculation according to the teaching of the present invention, and shows the rational fraction approximations and the factoring.

FIG. 9B shows a continuation of the calculation of FIG. 9A, including the diophantine solving procedure.

FIGS. 10A and 10B show a "post processing" procedure, and a numerical example by way of example.

DESCRIPTION OF THE PREFERRED EMBODIMENT

Figure 1A:
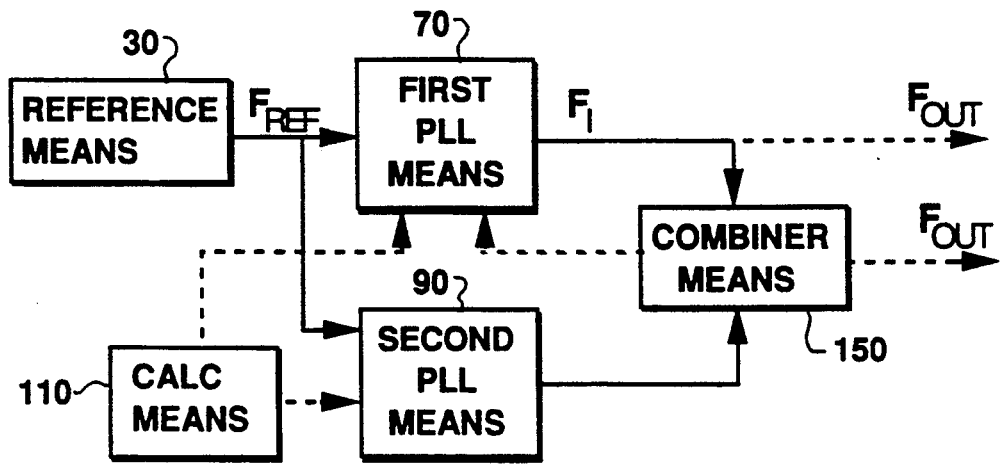
FIG. 1A is a schematic block diagram of a fixed reference synthesizer constructed in accordance with the invention.
Figure 1B:
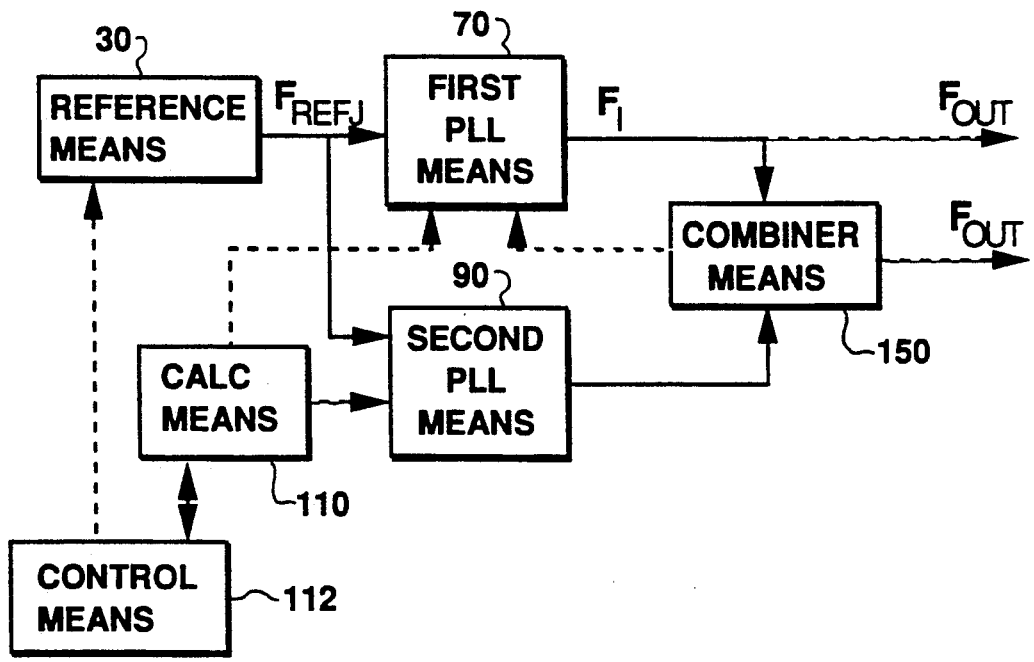
FIG. 1B is a schematic block diagram of an adjustable reference synthesizer constructed in accordance with the invention.
Figure 2:
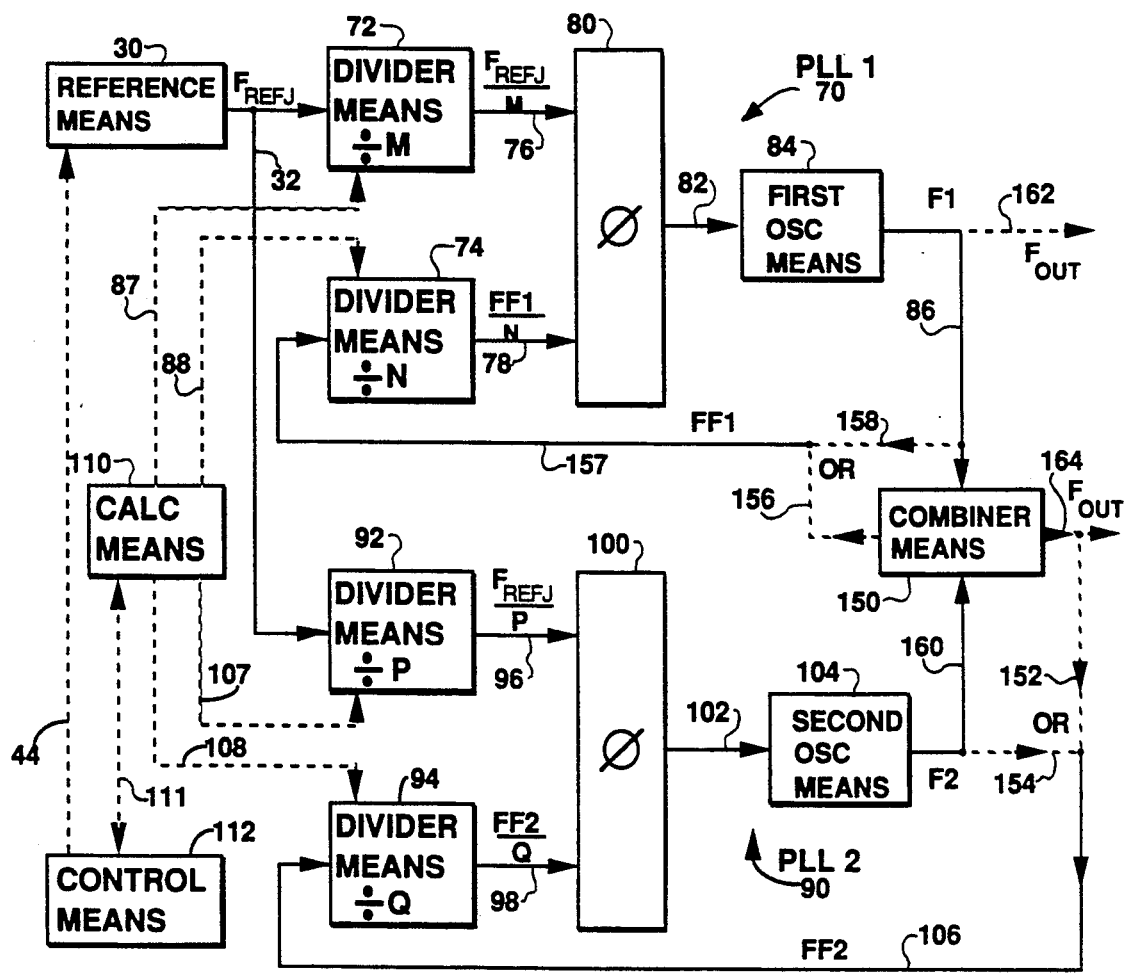
FIG. 2 is a more detailed block diagram of a synthesizer constructed in accordance with the invention.

FIG. 2 shows a detailed block diagram of the invention. As shown in FIG. 2, the output $F_{refj}$ 32 of a first reference means 30, with frequency $F_{refj}$ is applied to input terminals of a 1/M programmable divider means 72. Divider 72 can be programmed by control lines 87, to divide by a range of integers, from $M_{min}$ to $M_{max}$, and, like dividers 74,92, and 94, can be any form of binary, decimal, straight, dual modulus, multi-modulus, or even analog divider, as long as it is programmable under the control of 110. Divider output 76, at a divided down frequency of $F_{refj}/M$, is applied to an input of a phase and filter means 80. Said means are known in the art, and may contain a phase detector responsive to inputs 76 and 78, and generating a control signal 82 appropriate to drive controllable oscillator means 84. Phase and filter means 80 may instead be a frequency detector, responsive to a frequency difference between inputs 76 and 78 or it might be a combination of phase and frequency detector; each is known in the art. Said means 80 might also include integrators, filters, and amplifiers to further condition the signal to be output at 82. Such means are known in the art in many different forms, and block 80 and block 100 (and block 58 of FIG. 3C when used) are intended to show such prior art circuitry. The control signal 82 drives oscillator means 84 which is a controlled oscillator, whose output frequency F1 at 86 is responsive to the control signal at 82. Typically 84 is a voltage controlled oscillator (VCO) or sometimes a current controlled oscillator. The output 86 of oscillator 84 is at frequency F1. Said output is connected to the combiner means 150, and in some embodiments is connected to line 158 and 157 and hence to the input of divider means 74 of PLL 70. In some embodiments, it is also connected to line 162 as $F_{out}$. Buffer, amplifier, or isolator means that might be useful here, are not shown. Line 157 transmits a signal FF1 from either line 86 via line 158, or from the combiner means 150 via line 156, depending on the embodiment. Divider means 74 divides said input 157 by N and provides an output 78 of frequency $FF1/N$. 78 forms a second input to phase and filter means 80, and thereby closes the loop of PLL 70. When PLL 70 is locked, the inputs 76 and 78 are constrained to be at the same frequency, and thus $F_{refj}/M = FF1/N$ or:

$$FF1 = (N/M)*F_{refj} \quad (1)$$

The relation between FF1,F1,F2 and $F_{out}$ will depend on the embodiment and whether feedback line 157 receives its signal from line 158 or line 156. In an embodiment with a combined output (line 164), line 86 typically connects to line 158 and hence to line 157, so the signal on line 157 is F1; i.e.: FF1 = F1. In said embodiment, equation (1) becomes:

$$F1 = (N/M)*F_{refj} \quad (2)$$

In an embodiment with a combined feedback (FIG. 4B→FIG. 4H), line 157 connects to line 156 from the combiner means 150. In said embodiment, the signal on line 156 is the filtered sum or difference signal from combiner 150, thus we have FF1 = F1 − F2, so equation (1) becomes:

$$F1 - F2 = (N/M)*F_{refj} \quad (3)$$

Figure 4A:
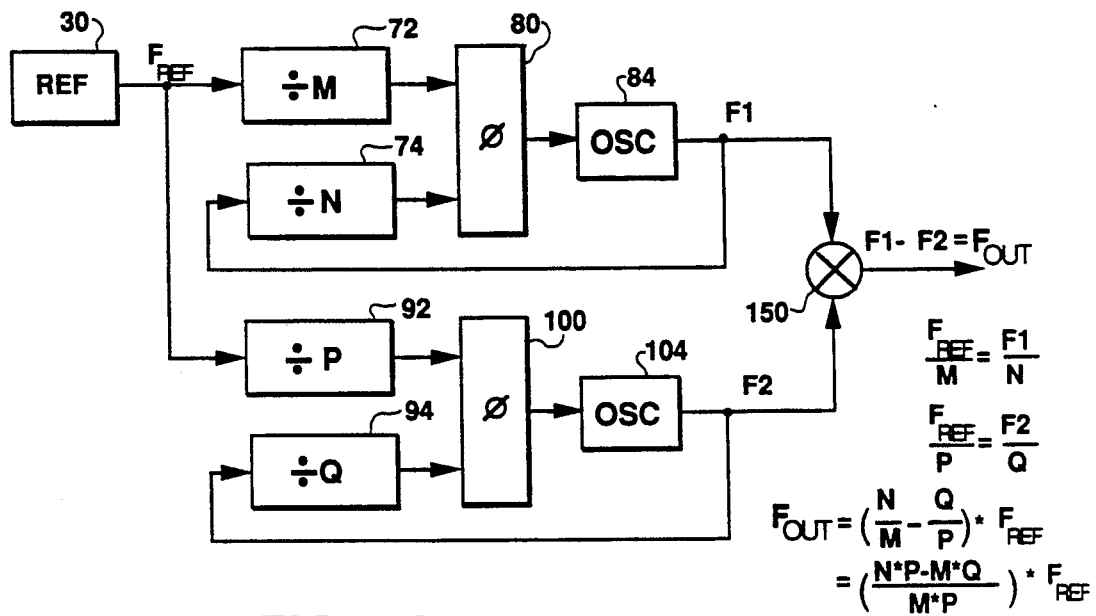
FIG. 4A is a schematic block diagram of a synthesizer constructed in accordance with a combined output version of the invention, and shows the design aquations for its two PLLs and for the overall synthesizer.
Figure 4B:
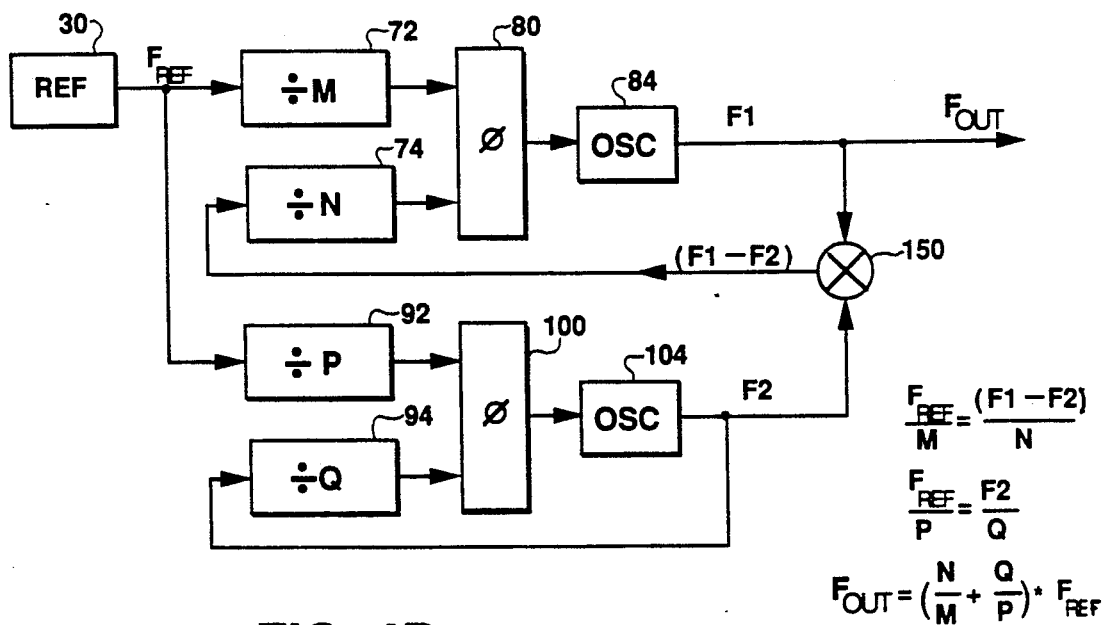
FIG. 4B–G are schematic block diagrams of synthesizers constructed in accordance with the combined feedback version of the invention and shows the design equations for its two PLLs and for the overall synthesizer.

PPL 90 can be quite similar in form to PLL 70 described above. It receives reference signal $F_{refj}$ on line 32 at the input to its first programmable divider means 92, wherein it is divided by P, and output-at 96 with frequency $F_{refj}/P$. Said output 96 is applied to an input of the phase and filter means 100. The output of phase and filter means 100 is control signal 102, which is input to the second oscillator means 104 and controls the frequency thereof. The output signal of 104 is on line 160 and has frequency F2. Said line 160 connects to the combiner means 150. Depending on the embodiment, it may also connect to line 154 and hence to the feedback line 106. Embodiments shown in FIGS. 4A and 4B and several others, use the line 154 path. Line 106 serves as the feedback path of PLL 90, and is applied to divider 94. After division by Q in divider 94, an output signal at 98 has frequency of $FF2/Q$. Said signal on 98 is applied to another input of the phase and filter means 100, and thereby the loop of PLL 90 is closed. When PLL 90 is locked, the inputs 96 and 98 are constrained to be at the same frequency, and thus $F_{refj}/P = FF2/Q$, or:

$$FF2 = (Q/P)*F_{refj} \quad (4)$$

which, for both the embodiments of FIG. 4A and FIG. 4B becomes:

$$F2 = (Q/P) * F_{refj} \quad (5)$$

So the overall design equation of the synthesizer is had by combining the chosen form of equation (1) with the chosen form of equation (4). In the particular case of the embodiment of FIG. 4A, we combine equations (2) and (5) with $F_{out} = F1 - F2$ to get:

$$F_{out} = F1 - F2 = (N/M) * F_{refj} - (Q/P) * F_{refj} = F_{out} = F_{refj} * (N/M - Q/P) \quad (6)$$

Similarly, in the particular case of the combined feedback embodiment of FIG. 4B, we combine equations (3) and (5) with $F_{out} = F1$ to get:

$$F_{out} = F1 = (N/M * F_{refj}) + F2 = N/M * F_{refj} + Q/P * F_{refj} F_{out} = F_{refj} * (N/M + Q/P) \quad (7)$$

FIG. 4C through FIG. 4I similarly shows the design equations of each of their PLLs, followed by the resulting design equation of the combined synthesizer.

Also shown in FIG. 2 is a calculation means 110 that calculates anew, for each requested new frequency $F_{req}$, appropriate values for M,N,P, and Q. Said values are then programmed into programmable dividers 72,74,92 and 94 via data paths 87,88,107, and 108 respectively. A control means 112 can, in some embodiments, send instructions on lines 44 to change the frequency of reference oscillator means 30. Said control means has stored the control values necessary to command reference oscillator 30 to produce, one at a time, any of a plurality of reference signals $F_{refj}$. Reference 30 will be described below. Control means 112 may be the same apparatus as calculation means 110; for example 110 and 112 may be a single microprocessor or embedded controller. The distinction intended by separating 110 and 112 schematically, is that the control 112 is limited to stored values for sending on 44 to 30 (typically under 20 pair of such values), whereas calculations means 110 actually calculates the values it sends out on lines 87,88,107, and 108. The method for choosing $F_{refj}$ values and for calculating M,N,P, and Q is described below.

Figure 3A:
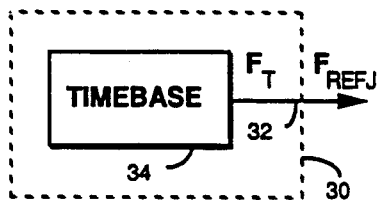
FIG. 3A shows a reference means consisting of a single timebase at one known frequency in accordance with a fixed reference embodiment of the invention.

FIG. 3A shows a reference means 30 according to a fixed reference embodiment of the invention. It is a single reference timebase as known in the art. 34 might comprise a crystal oscillator, and ovenized crystal oscillator (OCXO), a temperature compensated crystal oscillator (TCXO), or some more exotic stable timebase. In this embodiment, there is no control line 44, as there is just the single reference frequency $F_t$ available on line 32.

Figure 3B:
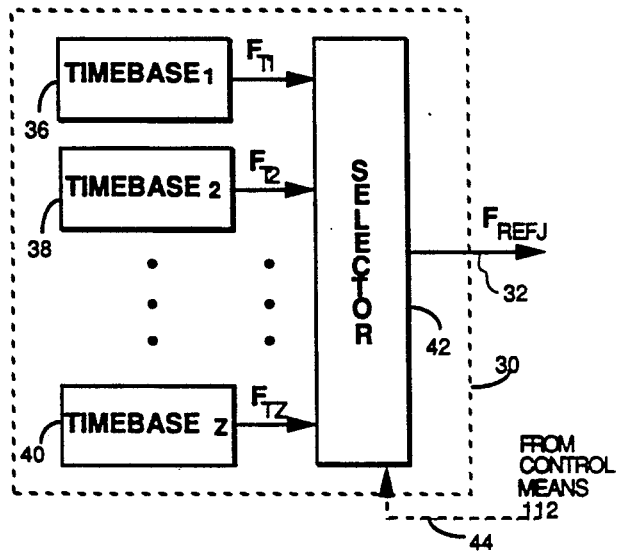
FIG. 3B shows a reference means comprising a plurality of timebase means and a selector means operating according to an adjustable reference embodiment of the invention.
Figure 3C:
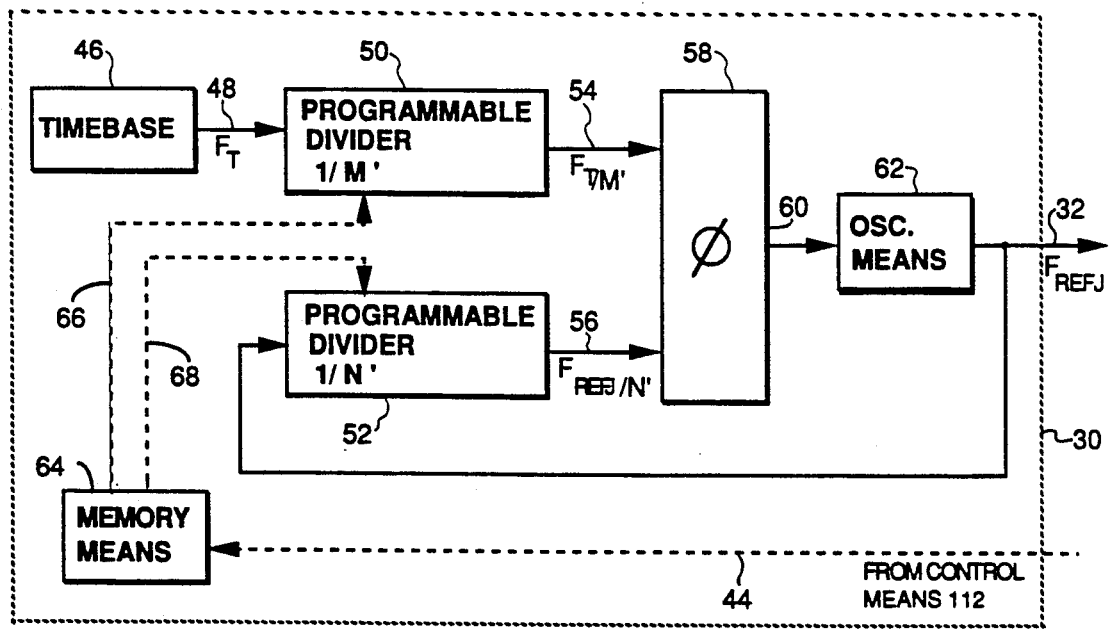
FIG. 3C shows a reference means comprising a timebase means, a phase-locked loop means and a memory and control means with a plurality of stored settings, operating according to an adjustable reference embodiment of the invention.

FIG. 3B and FIG. 3C show adjustable reference means 30, known in the prior art (this inventors application Ser. No. 07/769,093 entitled "Rational Fraction Synthesizer"), designed to deliver, at different times, more than one reference frequency $F_{refj}$ on line 32. In FIG. 3B, said adjustable reference comprises a plurality of individual timebases 36,38, ..., 40, of number two or greater, a selector means 42 with a plurality of inputs connected respectively to the outputs of said individual timebases, and with a single output 32. Said selector is responsive to control lines 44 from control 112, and under said control, it connects the chosen timebase to output line 32. In FIG. 3B, each timebase may comprise a crystal oscillator, or a TCXO, or an OCXO etc. Each oscillates at a frequency different from all the others, and the frequency of each ($F_{ref1}$, $F_{ref2}$, ... $F_{refz}$) is stable and known to the calculation means 110. The frequency variation between the largest and smallest $F_{refj}$ might typically be about 0.01% of $F_{refj}$, but this will vary with each particular embodiment of the invention. There is no requirement that $F_{refj} - F_{refj-1} = $ constant, since according to the present invention, each new $F_{refj}$ only must provide opportunity for a new and possible better approximation to expressions containing $F_{refj}$; it is not required to evenly fill in "gaps" between "course" frequency steps as in some prior art. Also, the method of FIG. 3B does not generally allow for either an "external reference in", or an "internal reference out", though one particular $F_{refj}$ could be at a "standard" frequency and be favored in a limited way by the calculation procedure. The advantage of the method of FIG. 3B is that for a small number of timebases, it could be less expensive than the scheme of FIG. 3C.

The cost of the adjustable reference shown in FIG. 3B goes up with each additional timebase that is added, and for embodiments requiring more than about three, another adjustable reference (FIG. 3C) may be preferable. In FIG. 3C, the adjustable reference signal 32 is generated by a PLL. A single timebase 46, which may be a crystal oscillator, OCXO, TCXO, exotic timebase, "external timebase in", or other, has output 48 of frequency $F_t$ connected to programmable divider means 50 wherein it is divided by $M_j'$ and output on line 54 at frequency $F_t/M_j'$. Line 54 connects to an input of the phase and filter means 58. The output of said phase and filter means is control line 60, responsive to the phase and/or frequency difference between inputs 54 and 56, and appropriate to drive oscillator 62 which may be a voltage controlled oscillator. The output 32 of said oscillator forms the output of the adjustable reference, and also connects to the input of programmable divider 52. Said dividers output is at 56, and has frequency $F_{refj}/N_j'$, and forms a second input to phase and filter means 58, and thereby closes the loop of the PLL. When the loop is locked, the inputs 54 and 56 are constrained to be at the same frequency, and therefore the design equation for the loop is: $F_t/M_j' = F_{refj}/N_j'$ or:

$$F_{refj} = (N_j'/M_j') * F_t \quad (8)$$

If controlled oscillator 62 is chosen to be a VCXO, then the signal out at 32 can have the excellent noise spectrum of a crystal oscillator, and in the preferred embodiment of the invention, oscillator 62 is a VCXO.

Typically, timebase 46 is chosen to be at a "standard" frequency such as 1 MHz, 5 MHz, or 10 MHz, and thus the frequency $F_t$ at 48 can be made available to the user as an "internal timebase out". Similarly, an "external timebase in" can be used in place of timebase 46, as long as said input is a simple multiple or sub-multiple thereof, could be used by merely altering all the stored values of $M_j'$ or $N_j'$ so that the values of $F_{refj}$ 32 are unaffected.

Other possible oscillators known in the art could serve as adjustable reference in the present invention, though I have not shown them explicitly. An example might be a free running VCXO driven by a D/A controlled by means 112 and calibrated such that means 112 "knows" the value of $F_{refj}$ that will result from various values sent to the D/A. Any such schemes must be able to provide and know the $F_{refj}$ values to an accuracy greater than that expected for the final $F_{out}$, since the further calculations to produce $F_{out}$ are directly proportional to the value of $F_{refj}$. So, though any timebase that produces a plurality of $F_{refj}$'s that are controllable by 112 and "known" to the calculation means 110 is deemed covered by the invention, the preferred version is often that shown in FIG. 3-C.

All of the PLL components heretofore mentioned, are known in the art. Also known in the art, is that often additional components such as buffers amplifiers, filters, splitters etc are necessary for the optimal operation of said loops. These components have not been specifically mentioned here because they are not the subject of the present invention, but they are assumed to be part of the loops where required. In addition, much prior art concerns itself with improving the electrical operation of PLL's, such as improving their speed of lock, decreasing their spurious noise, reducing their $F_C$ feedthrough, and so on. The present invention is independent of most of this art, but such art can still in many cases be profitably included in the PLL design when designing a synthesizer according to the teaching of this present invention.

The teaching of the present invention covers a number of variations on the detailed architecture of FIG. 2. FIG. 4A→FIG. 4I show, in more simplified block diagram form, a number of synthesizer architectures according to the teaching of the present invention. In each, the overall design equation involves sums and/or differences of two or more rational fractions and hence the teaching of the present invention can be applied to the calculation of their various division numbers (M,N, etc) and to their production of a high resolution $F_{out}$ signal. Each is shown with a fixed reference $F_{ref}$ (30), but also works well with an adjustable reference $F_{refj}$ (30).

FIG. 4A represents a synthesizer of the combined-output type. The design equations for its two individual PLLs are shown, as is the design equation of the overall combined synthesizer. FIG. 4B–FIG. 4H show several forms of combined-feedback synthesizer (combined-output teaching also has many variations, several of which parallel the combined-feedback versions described below). The variety demonstrated in FIG. 4A→4I, indicates the wide number of synthesizer architectures that result in a design equation containing a sum and/or difference of rational fractions, and thus the breadth of applicability of the present invention; it is by no means exhaustive.

FIG. 4B shows the simplest form of the combined-feedback architecture and its design equation.

Figure 4C:
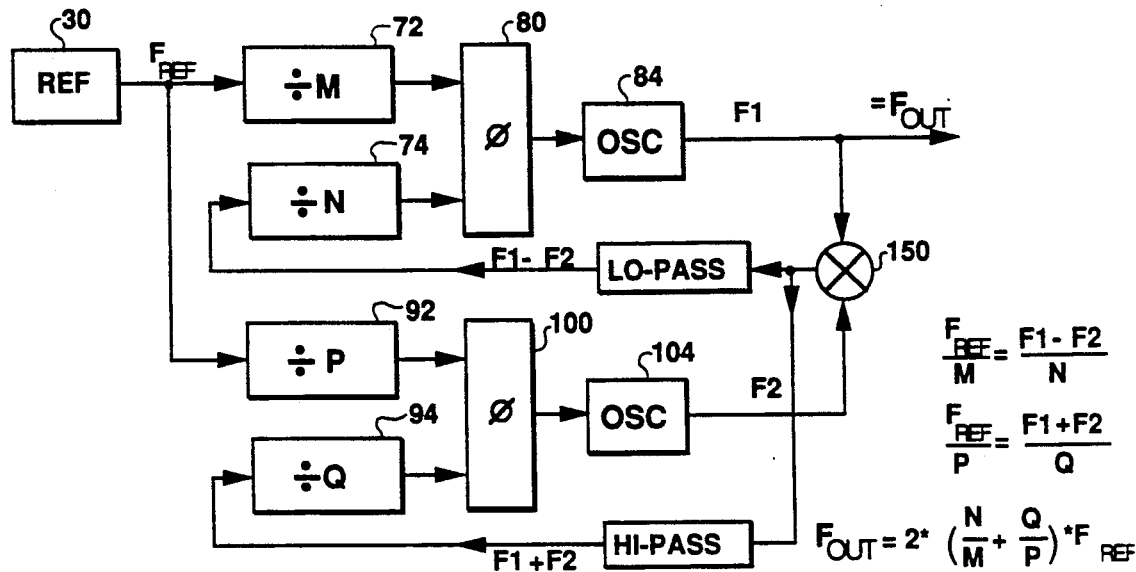

In FIG. 4C, each PLL receives a combined-feedback signal from the combiner 150, where a high pass low-pass diplexer provides a sum and difference signal respectively to the feedback paths of the second and first main PLL.

Figure 4D:
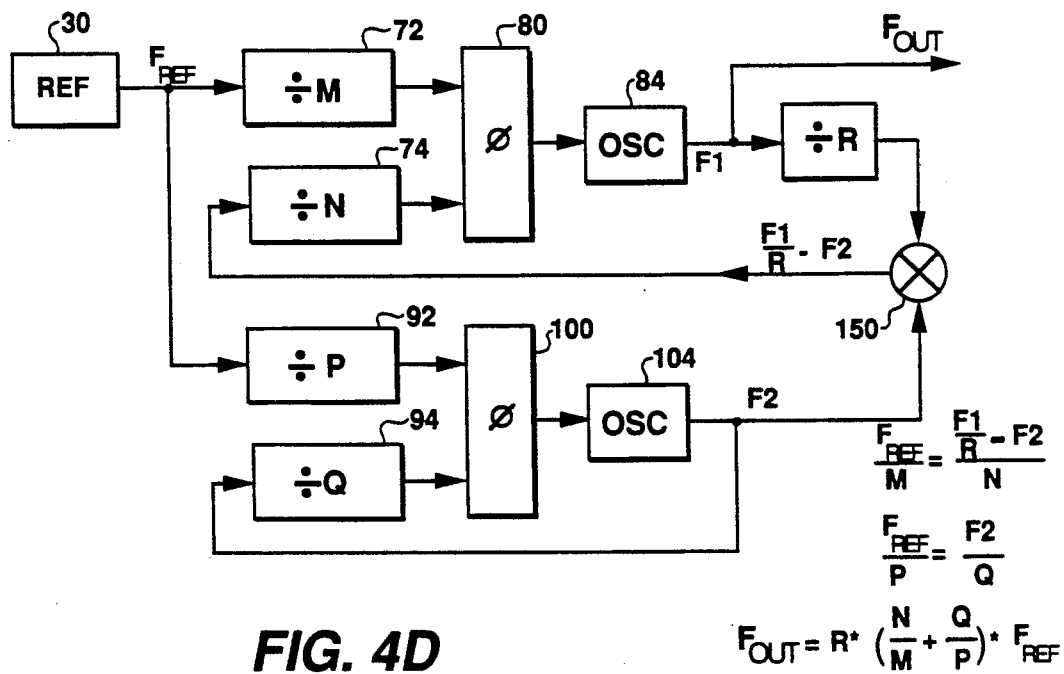

FIG. 4D shows a synthesizer where one of the two combined signals has been prescaled prior to being combined with the output of the second main PLL. This architecture might be useful where frequency F1 of the first PLL is at a much higher frequency than that of the second PLL. Such a prescaler typically divides by a fixed "R", but the present teaching also applies when R is variable, as long as it assumes a set value prior to any particular approximation.

Figure 4E:
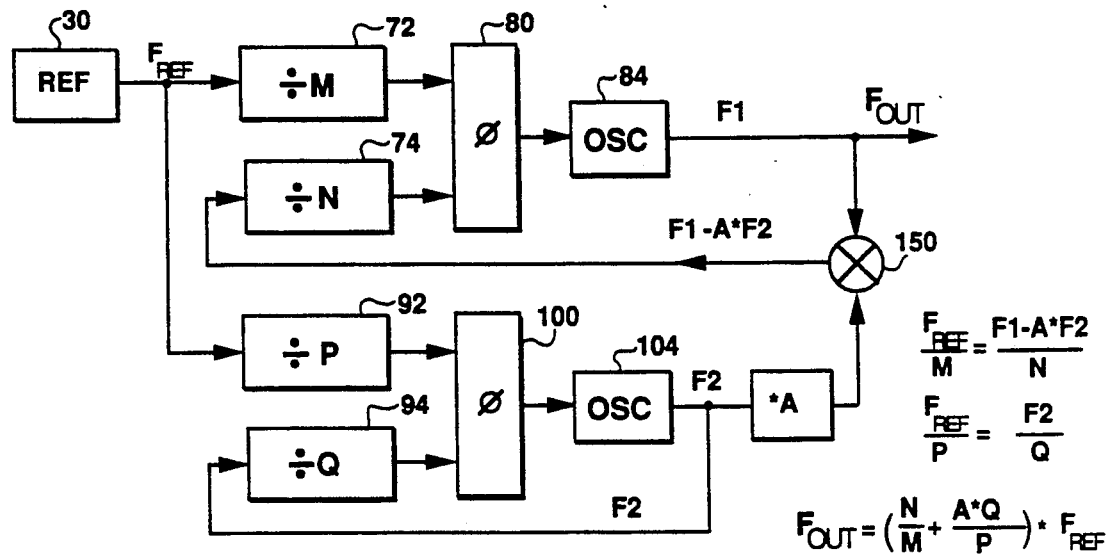

FIG. 4E shows a synthesizer where one of the two main PLLs has its output frequency multiplied before combining with the output of the other. The multiplication by A might, for example, comprise a fixed filter to pick out a fixed harmonic multiple of the frequency F2, or it might comprise a comb generator responsive to F2 and a variable filter able to select out any of several multiples of F2. Thus "A" may be a variable, as long as its value is fixed or known before each particular approximation procedure begins.

Figure 4F:
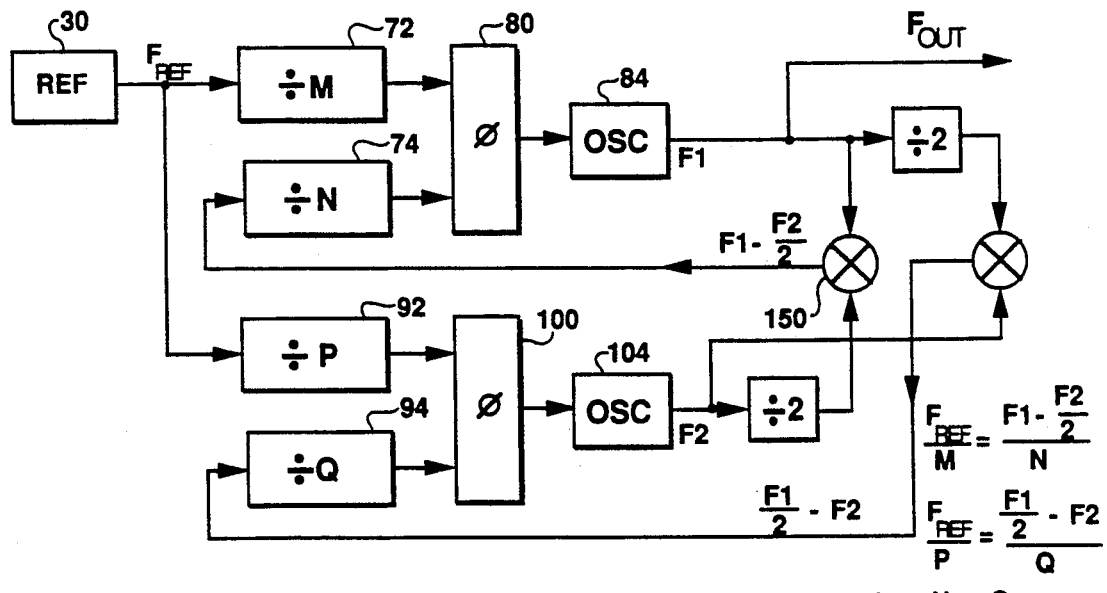

FIG. 4F uses binary dividers and two combiners to provide feedback signal to its two PLLs. This architecture has a higher parts count than some, but has lower frequency signals being fedback and hence the reference noise multiplication within the loop is somewhat reduced. In a way similar to that used with some other forms of the equation also containing extra coefficients in its expression, the calculation proceeds as before, but initially calculates $P_i' = 2*P_i$. Then, if $P_i'$ is even, it is divided by two to give a value for $P_i$, whereas if $P_i'$ is odd, then $P_i' = P_i$ and $Q_i' = 2*Q_i$; either way, their ratio is unchanged and hence the frequencies are unchanged.

Figure 4G:
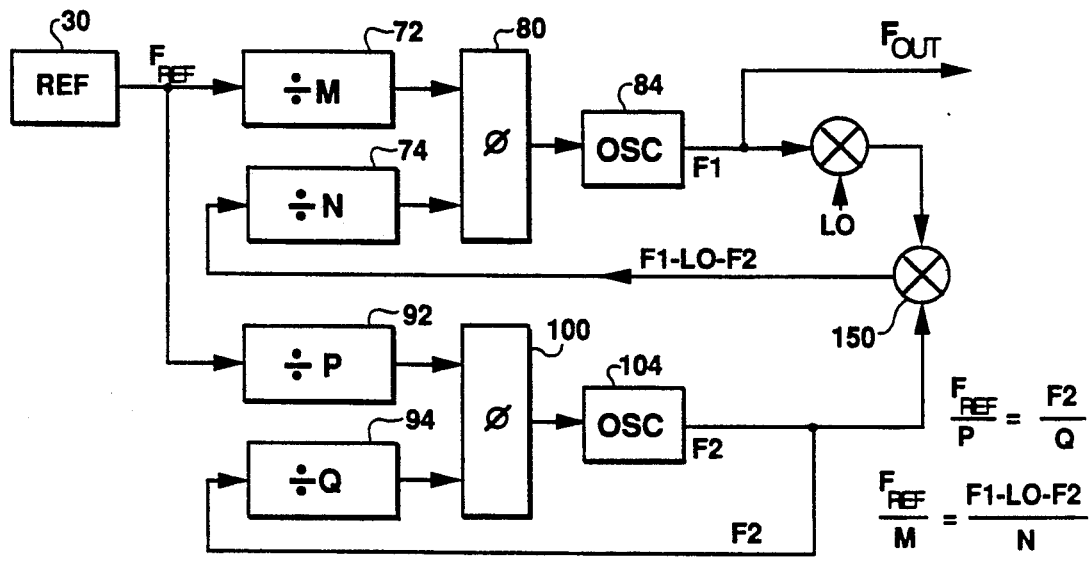

FIG. 4G shows a synthesizer wherein one PLL has its oscillator's output downconverted before it is combined or mixed with the output of the second PLL. This might be useful where a low noise L.O. (local oscillator) signal (perhaps from a crystal-comb-filter system) is available and could lead to a lower noise synthesis. Also note, that if the L.O. is capable of being even slightly variable (under the control of the calculation-control means), then it, rather than a variable $F_{refj}$, could be used as the source of variation in the ratio ($F_{out}$–-L.O.)/$F_{ref}$ to allow multiple approximation attempts to get the best resolution.

Figure 4H:
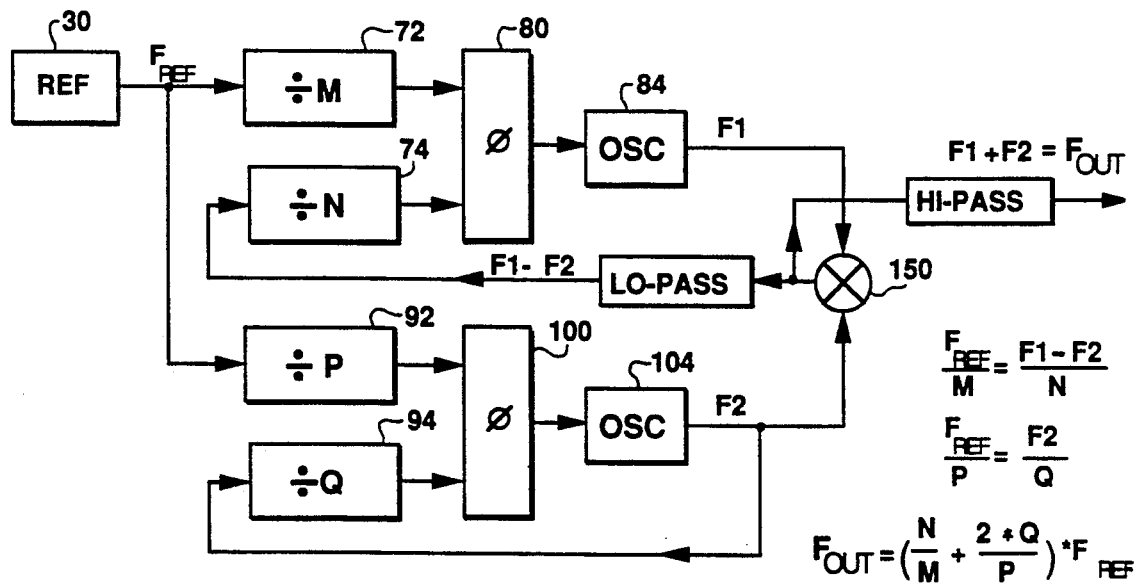
FIG. 4H is a schematic block diagram of a synthesizer constructed in accordance with the invention, showing a synthesizer wherein both the feedback path and the output path comprise combined signals, and shows the design equations for its two PLLs and for the overall synthesizer.
Figure 4I:
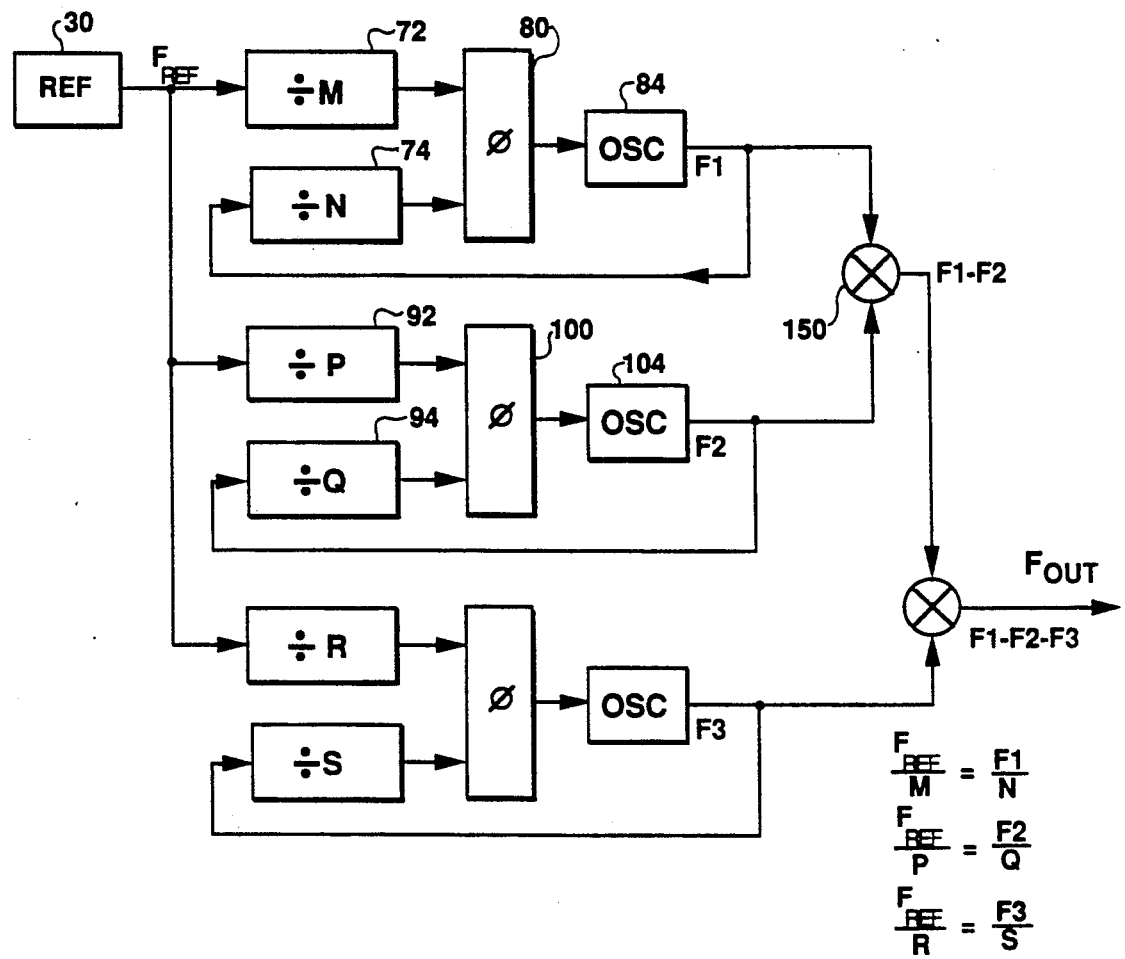
FIG. 4I is a schematic block diagram of a synthesizer constructed in accordance with the invention, showing a synthesizer with more than two main PLLs and where the design equations for the overall synthesizer is still a series of sums and differences of rational fractions.

FIG. 4H shows a synthesizer according to the teaching of the present invention wherein both the feedback and the output are responsive to combined signals. In the version shown, a high-pass filter selects F1+F2 for the output, and a lo-pass filter selects F1−F2 for the feedback; the two filters could be swapped and the resulting synthesizer could still be operated according to the present teaching.

FIG. 4I shows a synthesizer according to the present invention, wherein there are more than two main PLLs with combined outputs and/or feedback. Once again, however, the overall design equation is shown to be of a form comprising sums and/or differences of two or more rational fractions. Here one would arrive at a step where $Y_i = M_i*P_i*R_i$ and $X_i = N_i*A_i - Q_i*B_i - S_i*C_i$. One must be able to factor $Y_i$ into three "acceptable" factors $M_i, P_i$, and $R_i$; then calculate $A_i = R_i*P_i$, $B_i = -M_i*R_i$, and $C_i = M_i*P_i$; and finally use known diophantine equation techniques to solve the $X_i$ equation for the remaining integers $N_i, Q_i$, and $S_i$. Since the "acceptability" size limits are on $M_i$ etc, and not on $Y_i$, it is possible (upon a successful triple factoring), for such a "triple" $Y_i$ to be larger, for any given size limit for $M_i$ etc, than a corresponding "double" $Y_i$ with the same $M_i$ etc. size limits. Hence its error ($< 1/Y_i^2$) can be much better. Clearly though, successfully factoring a given $Y_i$ into three factors is less likely than is a successful double factoring, so many more approximation attempts might be necessary. As with architectures comprising two main PLLs, those with three also come in many forms, including variations of those shown in FIG. 4A→FIG. 4H. Embodiments with more than three main PLLs are also possible.

OPERATION

The operation of the PLLs is conventional as described above. The novel aspect of the present invention arises in programming all dividers in the PLLs, and in their combination with a calculation procedure to generate the divisors and to control when necessary, the reference source of the synthesizer.

Figure 5:
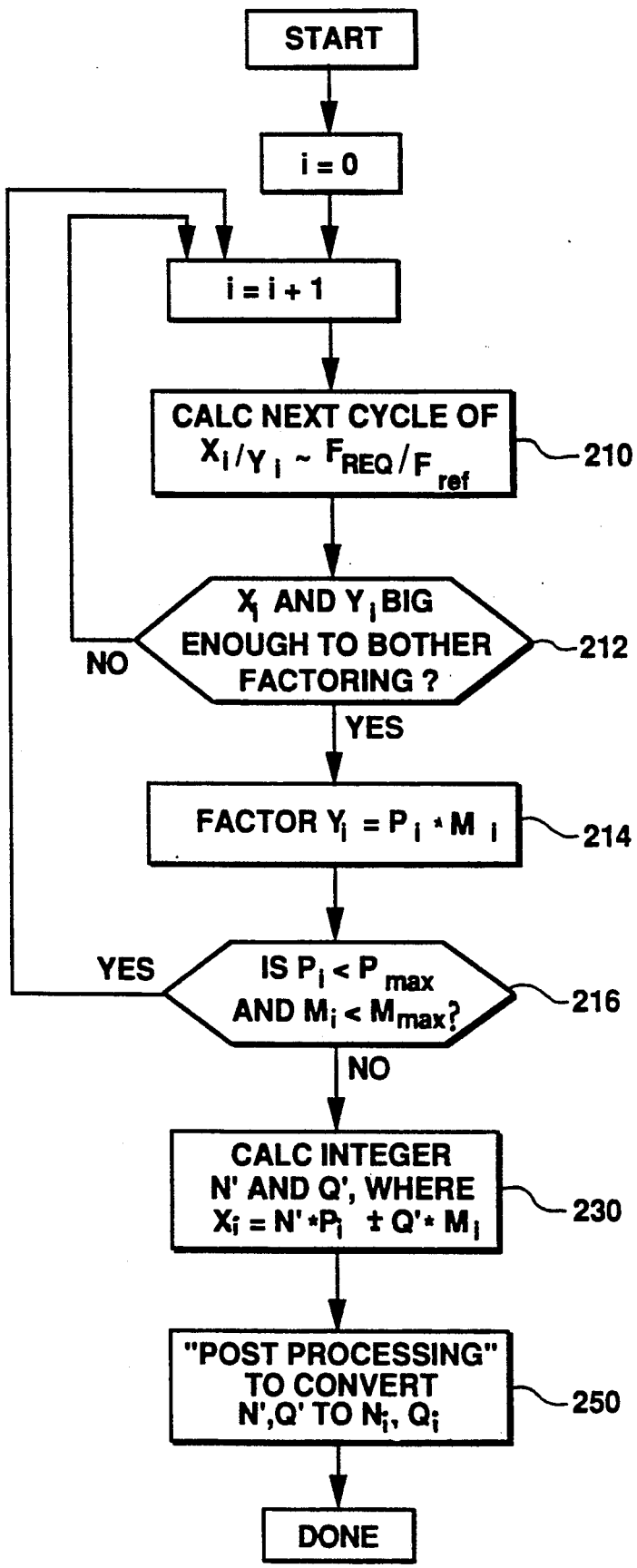
FIG. 5 is a flow chart description of a calculation procedure for a fixed reference embodiment of the invention.

In simplest terms, and shown in FIG. 5, the calculation means 110 receives a value of $F_{req}$ (from hardware not shown), whereupon the calculation means of the invention makes a plurality of rational fraction approximations $(X_i/Y_i)$ to the known value $F_{req}/F_{ref}$. Each succeeding cycle of the approximation procedure provides a better and better approximation, while the sizes of $X_i$ and $Y_i$ get progressively larger. Most embodiments try to calculate values of $X_i$ and $Y_i$ that are simultaneously good approximations of $F_{req}/F_{ref}$, and wherein $Y_i$ is factorable into two integers $M_i$ and $P_i$: $Y_i = M_i*P_i$, with $M_i < M_{max}$ and $P_i < P_{max}$ if that succeeds, and the difference between $X_i/Y_i$ and $F_{req}/F_{ref}$ is smaller than a predetermined limit, then the calculation procedure can further solve the diophantine equation:

$$X_i = AA*P_i - BB*M_i, \qquad (9)$$

for the two intermediate integers AA and BB, and hence have solutions for:

$$F_{out}/F_{ref} = X_i/Y_i = (AA*P_i - BB*M_i)/(P_i*M_i), \text{ and} \qquad (10)$$

$$F_{out}/F_{ref} = AA/M_i - BB/P_i \qquad (11)$$

Finally, "post processing" begins with AA and BB, and from there calculates $N_i$ and $Q_i$ selecting from among the many possible values, for those that fit the particular needs of the invention while still satisfying equation (11).

Figure 6:
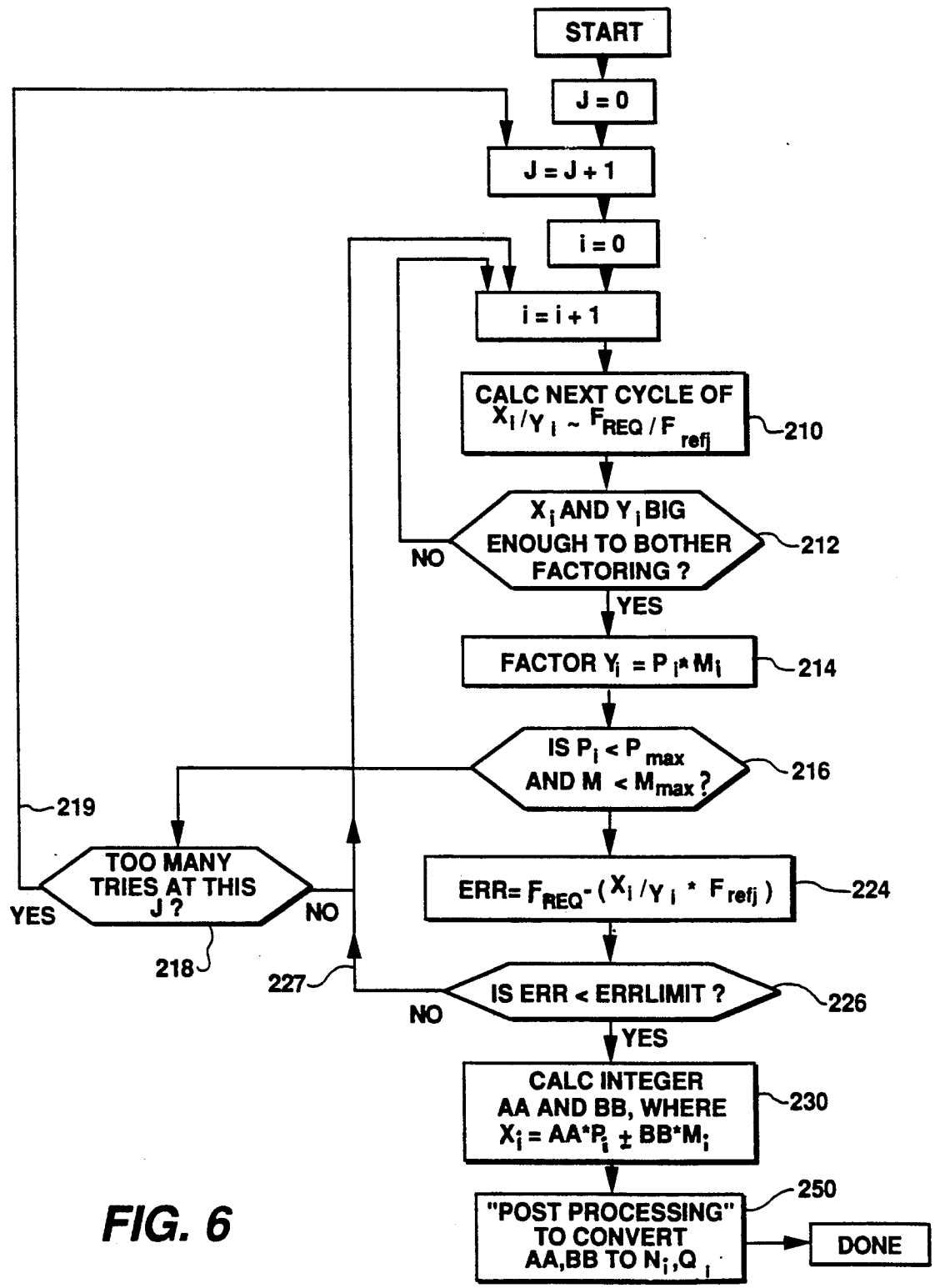
FIG. 6 is a flow chart description of a calculation procedure for an adjustable reference embodiment of the invention.
Figure 7:
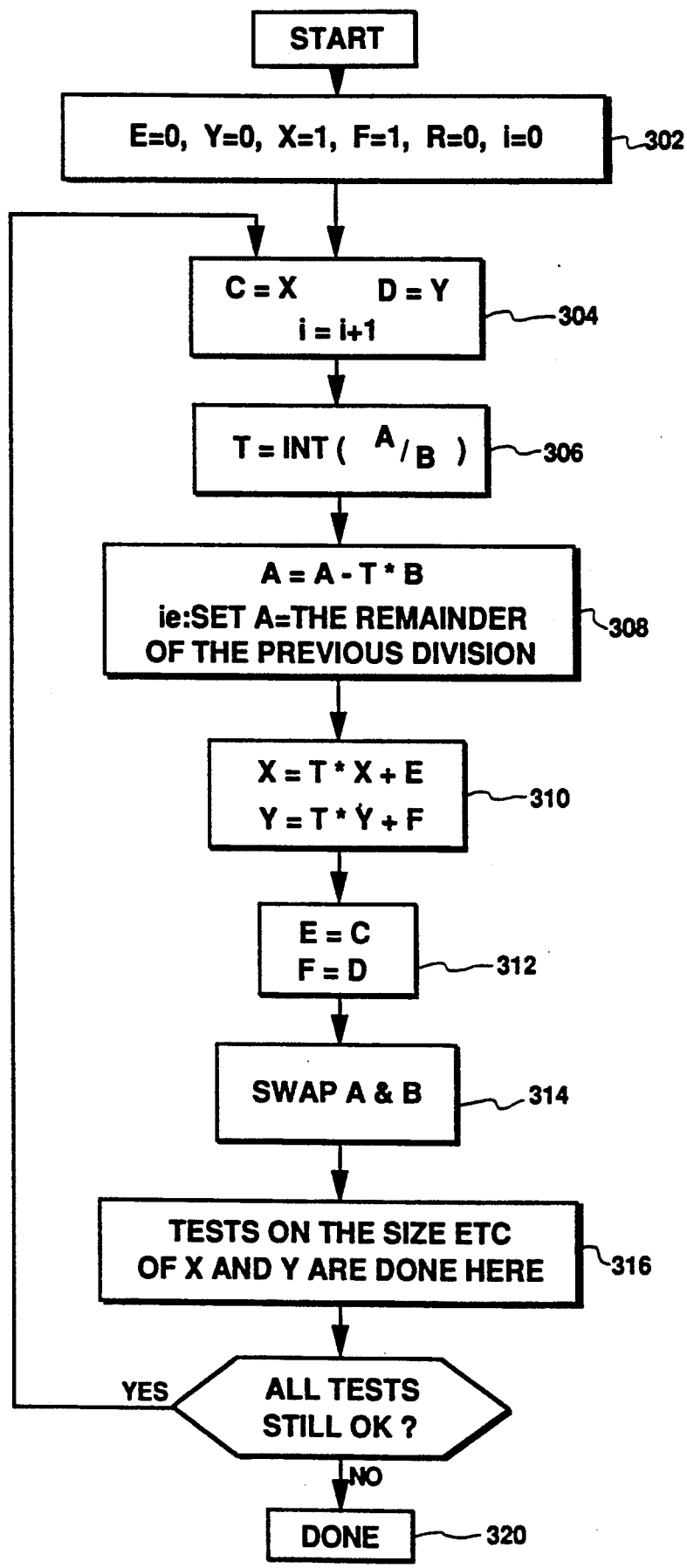
FIG. 7 is a detailed flow chart description of a rational fraction calculation procedure of Block 210 of FIG. 5 and FIG. 6.

In another form of the invention, with a flow diagram shown in FIG. 6, a variable reference $F_{refj}$ is available, and, in the situation where the error $(F_{req} - F_{out})$ at the end of the approximation proceeding is not small enough, a new $F_{refj}$ is selected and the procedure run again, repeating until an approximation with a sufficiently small error is obtained. The approximation process of the preferred embodiments (step 210 below) comprise a form of Euclid's algorithm. This algorithm is known in the prior art of mathematics, and its basic steps are shown in FIG. 7 and illustrated by way of example in FIG. 8. Further detail on Euclids algorithm can be found in this inventors application Ser. No. 07/769,093, and a description of its use in synthesizers whose equations contain products of rational fractions is found in this inventors U.S. Pat. No. 5,144,254.

To make the discussion more specific, I will describe the operation of a combined-output embodiment of the invention, along the line of FIG. 4A. The operation of the calculation procedure for the other embodiments differs mostly in the final portion of said procedure, hereinafter called "post processing", and these differences will be described below.

In more detail, and following the flow diagram of FIG. 6, calculation means 110 receives a request for a new $F_{req}$ from hardware not shown. The calculation process then initializes j and i to their starting values. j is used with the adjustable reference, and refers to the $j^{th}$ possible reference frequency. In FIG. 3B, this is the frequency of timebase j, selected and available on line 32 as $F_{refj}$; in FIG. 3C it would be again the frequency on line 32, when dividers 50 and 52 have been programmed with values $M_j'$ and $N_j'$ respectively and $F_{refj} = (N_j'/M_j')*F_t$. The i refers to the $i^{th}$ cycle of the approximation process as shown in FIG. 6. After initialization, i is incremented and the first approximation $X_i/Y_i \sim F_{req}/F_{refj}$ is calculated (210). The next step is to factor $Y_i$, but the first few values of $Y_i$ typically will be such poor approximations that it is quite unlikely that $$err_{ij} = F_{req} - F_{out} = F_{req} - \{(X_i/Y_i)*F_{refj}\} \qquad (12)$$

will be less than errlimit, and as a time saver the process may skip (212) the factoring of the first few values of $Y_i$. Said step (212) is not integral to the invention, and whether or not it is included depends on considerations such as speed of factoring, available memory, overall speed requirements and so on. After i (or $Y_i$) is large enough to make it worthwhile to begin factoring, the process reaches block 214, wherein $Y_i$ is factored. There, a factoring means, typically part of calculation means 110, calculates $Y_i = P_i*M_i$. If $Y_i$ is prime, then the factor means sets one factor=1 and the other $=Y_i$, for example: $P_i=1$ and $M_i=Y_i$. Such factor means are known in the art of number theory and may include any of several calculation procedures or other procedures. Such means would typically be chosen according to a speed criterion, though a cost criterion might also be important. After $M_i$ and $P_i$ have been calculated, they are tested to see if they are "acceptable", where "acceptable" values $Q_i$, $N_i$, $P_i$, and $M_i$ are integers that are respectively within the programming ranges of programmable dividers 94, 74, 92, and 72. As defined in the attached glossary (incorporated herein by reference), "acceptable" hereinafter shall refer to said values for $Q_i$ such that $Q_i < Q_{max}$, $P_i$ such that $P_i < P_{max}$, and so on.

If the test fails either because $M_i$ or $P_i$ was too large, the process moves to block 218. Here the procedure determines whether there have been too many cycles at this value of j; in other words whether i should continue to be incremented for another cycle of the approximation or alternatively whether all subsequent i's will fail and a new sequence should begin with a new value of j and with i starting over at its initial value. The most direct version of this test would be a test for $Y_i > Y_{max}$, where $Y_{max} = P_{max}*M_{max}$. If $Y_i > Y_{max}$, then there will never be additional "acceptable" $M_i$ and $P_i$ values generated by incrementing i, because the integers $X_i$ and $Y_i$ calculated by block 210 always increase in size for each increment in i. This test is not the same as the test in block 216 however, because it may well happen that $P_i > P_{max}$ but $P_{i+1} < P_{max}$, depending on how $Y_j$ happens to factor. If test 218 fails (too many tries), then a new j is chosen and the control means 112 could eventually be instructed to change the hardware of first oscillator 30 to produce a new reference frequency $F_{refj+1}$, i is re-initialized and a new approximation sequence is begun. If test 218 is passed ($Y_i$ not greater than $Y_{max}$) then i is incremented and another cycle of approximation is carried out by process step 210.

If at block 216 both $M_i$ and $P_i$ are "acceptable", then block 224 and 226 test to see if the overall error limit of the $i^{th}$ approximation of reference clock j is acceptable. If not (path 227), i is incremented for a new cycle of the approximation. If so, then the approximation portion of the calculation is completed, and values for $F_{refj}$, and "acceptable" values of $M_i$ and $P_i$ have been calculated.

Before going on to the diophantine equation procedure of step 230, it must be noted that many other variations of the preceding calculation procedure are possible as part of the present invention. For example, test block 212 could be deleted; or a long sequence of $X_i, Y_i$ values could be calculated before any of the factoring and "acceptability" tests is done. Similarly, test 226 could be carried out in a different way, that might be less exact, but much faster, by testing on a known number that is indicative of "err", without actually carrying out the calculation of equation (12) (step 224). All such choices of sequence will depend on the capabilities of the particular calculation means 110 and the criteria to be optimized. Such criteria typically put speed of calculation first, but could just as well be optimized for hardware costs etc.

FIG. 9A shows by way of example, a calculation according to the above described procedure. Here, the invention has received a request frequency $F_{req}$=987.003434 MHz, and begins with a reference frequency $F_{refj}$=$F_{ref1}$=(N'1/M'1)*$F_t$=(1163/775)*10.000 MHz=15.00645161 MHz, and uses $P_{max}$=$M_{max}$=1500, and errlimit=$5\times10^{-12}$. Note that both $F_{req}$ and $F_{ref1}$ were first multiplied by 256 (at i=0) to guarantee that the internal arithmetical resolution—here using fixed point arithmetic—was always better than was required for the final useful result. The euclid procedure is run, calculating better and better approximations ($X_i/Y_i$) to $F_{req}/F_{refi}$. At i=9, after nine cycles of the euclid calculation procedure, the variable $Y_i$=1732 has reached a size where it is worth the time to try to factor it. The factor means (part of calculation means 110) gives $Y_i$=1732=4*433=$P_i$*$M_i$. Each of these factors is "acceptable" (<1500), so the relative error is calculated:

$$err_{ij} = F_{req} - F_{out} = F_{req} - \{X_f Y_f * F_{refj}\} \quad (12)$$
$$= 987.003434 - \{(113917/1732)*(1163/775)*10.000\}$$
$$= 987.003434 - 987.00343441$$

and $err_{ij}/F_{out} \sim 4*10^{-10}$(0.4 ppB). Small as this error is, it is still too large, so another cycle of the euclid calculation is run.

This next cycle (i=10), gives $Y_{10}$=20,841. This is factorable: $Y_{10}$=$P_i$*$M_i$=3*6947, but here $M_i$=6947 is not "acceptable" in that it is greater than $M_{max}$(=1500). So—since we haven't been at this j too long—i is incremented and another cycle of the euclid procedure is run, because even though this $M_{10}$ was >$M_{max}$, $Y_{10}$ is still <$Y_{max}$ ($Y_{max}$=$P_{max}$*$P_{max}$=1500*1500=2,250,000).

This time (i=11), $Y_{ii}$=43414, and the factor means gives: $Y_{ii}$=$P_i$*$M_i$=49*886. These are both "acceptable" and indeed at this point the err $\sim 4*10^{-12}$ (or $\sim 0.004$ ppB) is better than the chosen error limit, so the cycling of the euclid calculation can end.

Remember that the design equation is of the form of Equation (10)

$$F_{out}/F_{refj}=X_1/Y_i=(AA*P_i-BB*M_i)/(P_i*M_i) \quad (10)$$

and so far we've successfully calculated integers $P_i$=49 and $M_i$=886. Thus at step 230 of FIG. 6, calculation means 110 calculates the integers AA and BB that will properly solve the equation:

$$X_i=(AA*P_i-BB*M_i) \quad (9)$$

Such an equation, when $X_i$, $P_i$ and $M_i$ are known, and with integer solutions for AA and BB, is called a Diophatine equation. It is solved by using a variation of Euclid's algorithm. Following the same assignment of variable names used in the FIG. 7 and FIG. 8, the calculation means 110 identifies (FIG. 9B) $M_i$=$M_{ii}$=886 as "A'" and $P_i$=49 as "B'", and then runs the Euclid algorithm until $A'_k$=0 (at step k=3). It then calculates AA=$X_{ii}$*$E'_3$=2,855,423*217=619,626,791 and BB=$X_{ii}$*$F'_3$=2,855,423*12=34,265,076. We note that these AA and BB values do satisfy Equation (9), as follows: $X_i$=AA*$P_i$-BB*$M_i$ 2,855,423=619,626,791*49-34,265,076*886=30,36-
1,712,759-30,358,857,336

The diophantine calculation procedure of step 230 has thus produced a set of integers AA and BB which satisfy equation (9), but are much too large to be used as $N_i$ and $Q_i$ values. A further calculation procedure however, can fix this, as well as accommodate some special hardware requirements of each specific embodiment; I've called it "post processing".

In "post processing", the calculation means 110 starts with $F_{out}/F_{refj}$=+-AA/$M_i$-+BB/$P_i$. Then, to make more useful AA's and BB's it will add and subtract an integer "u" on the left side of the equation. This changes the sizes of AA and BB, while continuing to satisfy equation (9): +-((AA/$M_i$)-u)-+((BB/$P_i$)-u)=$F_{out}/F_{refj}$=+-(AA-u*$M_i$)/$M_i$-+(BB- u*-$P_i$)/$P_i$. By calculating "u" correctly it can not only reduce the sizes of AA and BB enough for them to be "acceptable" values for $Q_i$ and $N_i$ respectively, but can further tailor them to fit the architecture and perhaps to fit special hardware requirements.

As a concrete example, consider the synthesizer of FIG. 4A and a case where the hardware of VCO1 (84) accommodates most of the range of $F_{out}$, while the variation of VCO2 (104) is designed to be small, and confined to a frequency of $F_{refj}$ and below. In such a case, the "post processing" goals would include: 1) to end up with a minus sign in $N_i/M_i$-$Q_i/P_i$=$F_{out}/F_{refj}$, 2) to have $Q_i$<$P_i$ and hence $Q_i/P_i$<1, and 3) the usual requirement that $N_i$<$N_{max}$ and $Q_i$<$Q_{max}$, etc. All such requirements can be met by a correct choice of "u". Complicating things is the fact that initially we don't know whether AA/$M_i$>BB/$P_i$ or AA/$M_i$<BB/$P_i$. The calculation means 110 must therefore be able to handle both situations. The two parallel procedures are shown in FIG. 10A. Since $F_{out}/F_{refj}$ must always be positive, the +- signs of the diophantine equation are fixed by the relative sizes of AA/$M_i$ vs BB/$P_i$.

In the numerical example above, we had AA/$M_i$>BB/$P_i$, so the left hand column of FIG. 10A is the appropriate calculation. That sample calculation is shown in FIG. 10B. The end result is:

$$F_{out}/F_{ref}=CC/M_i-DD/P_i=58509/886-13/49$$

Here, for the embodiment of FIG. 4A, calculation means 110 would set $Q_i$=DD and $N_i$=CC, and that would conclude the "post processing".

In the same way that the preceding calculations made the $Q_i/P_i$ term negative and approximately equal to 1, similar choices for "u" can result in other final forms of the design equation. A very obvious example would be a value of "u" that differs by 1 from the above value, and would thereby result in a $Q_i/P_i$ term that is small but positive, as is required for the hardware configuration of the embodiment shown in FIG. 4B. Other hardware considerations might require a different approximate "size" for the $Q_i/N_i$ term. If, for example, if the reference frequency were about 10 MHz, and the second oscillator means (104) had a range centered around 150 MHz, then the size of the $Q_i/P_i$ term must be about 15. Such requirements are easily accommodated by obvious variations on the "post processing" calculations described above. Additional post processing techniques are described in this inventors Disclosure Ser. No. 266912. Further techniques, to serve other architectural constraints, will be obvious to those skilled in the art, after understanding the previous description.

The "acceptable" values $M_i$, $N_i$, $P_i$, and $Q_i$ calculated by the calculation means 110, can vary considerably in actual size. For example, if $M_{max}=1000$ and $N_{max}=3000$, one might get (in response to requests for various $F_{out}$ values) $M_i$, $N_i=937,1293$; 17,27; 806,3192; 391,823 etc. The only guarantee is that the legal $M_i$'s will be less than $M_{max}$ and $N_i$'s will be less than $N_{max}$. These values of $M_i$ and $N_i$ will work if loaded into the appropriate programmable dividers, and their ratio is appropriate for the given $F_{out}$. It is known, however, to those skilled in the art of PLL's, that many important characteristics of a PLL (such as stability, time of lock, gain, noise, etc.) are influenced by the actual size of $N_i$ and $M_i$). Thus in addition to the calculations described in FIG. 5, FIG. 6, and FIG. 7, it may be necessary to "scale up", for example, the original $M_k$ and $N_k$ values by multiplying each by the same constant s. s might be set equal to the lesser of int($N_{max}/N_k$) and int($M_{max}/M_k$), so that when $s*N_k$ is loaded into divider 74, and $s*M_k$ is loaded into divider 72, we can be assured that each is "acceptable", i.e.: $s*N_k<N_{max}$ and $s*M_k<M_{max}$. When the scaled up values of M and N (and similarly for P and Q) are used in the dividers, the value of $F_{out}$ is unchanged, because:

$$F_{out}=((Q_k*v)/(P_k*v)*(N_k*s)/(M_k*s))*F_{ref}=(Q_k/P_k)*(N_k/M_k)*F_{ref}$$

It may seem strange to be increasing the integers to be sent to the program counters, but the general goal is not for every $N_i$ to be as tiny as possible, but rather for the invention to teach a way for $N_{max}$, $M_{max}$, etc. to be as small as possible.

Even with the above scheme, one might still get variations as large as a factor of two in the size of $N_k*$s, and so on. In the highest performance versions of the PLL (70, and 90), it might be considered necessary to modify the amplifier or filter or both of means 80 (and 100) to further compensate for this remaining size variation in $N_i*$s. Such active alterations to the amplifiers, integrators and or filters of a PLL are not widely used (due to cost and complexity reasons), but they have been described in the art. Similar scaling for $P_k$ and $Q_k$ may be necessary, as well as similar control of the characteristics of means 100.

There might be situations where all of the calculations for a plurality of $F_{req}$'s would be done before they are needed, and the results ($N_i$, $P_i$ etc.) stored in memory. Then when a new $F_{req}$ was required (among the limited set that was precalculated) these number sets would need merely to be latched into the programmable counters. The number of such pre-computed integers could be fairly large, but would be limited by memory size, and would always be tiny compared to the billions of other frequency combinations the invention could produce. They could nonetheless, be useful in situations like: 1) "frequency hopping" and 2) a "stored setup" feature in a benchtop synthesiser, and are to be considered as part of the teaching of the present invention. Indeed, where memory was cheap and calculation time or capability expensive, and the number of $F_{req}$'s limited (even if very large), one could imagine a synthesizer where all the calculations were done according to the present invention, but done "back at the factory", and all the results stored in the memory, so that the calculation means could for the most part be eliminated from the final product. Such a synthesizer is also to be considered part of the teaching of the present invention.

There has thus been shown and described a novel frequency generator which fulfills all the objects and advantages sought therefor. Many changes, modifications, variations and other uses and applications of the subject invention will, however, become apparent to those skilled in the art after considering this specification and the accompanying drawings which disclose the preferred embodiment thereof. All such changes, modifications, variations and other uses and applications which do not depart from the spirit and scope of the invention are deemed to be covered by the invention which is limited only by the claims which follow.

GLOSSARY

I have tried to use standard definitions for all of my text, but I do use a few terms with a more specific meaning—mostly to be able to use a phrase over and over, instead of having to use a whole paragraph over and over. These include:

"ACCEPTABLE" VALUES: are divider values M, N etc which are smaller than some pre-defined limit values $M_{max}$, $N_{max}$, etc. The limit values are at most the size of their respective programmable counters (which have some maximum division capability), but they could also be much smaller, depending on other constraints such as various PLL dynamic characteristics that are to be optimized, such as noise, reference feedthrough, time of lock, etc.

COMPARISON MEANS: is essentially the phase detector, integrator and filter. It also would include a frequency detector or (as is most common) a hybred of the two. I've also lumped in here (for the sake of brevity) the integrators, filters, etc, necessary to condition the control signal before it is shipped to the controllable oscillator.

DESIGN EQUATION: here is used to name the equation which relates the four PLL variables $F_{in}$, T, U, $F_{out}$; where $F_{in}$ is the frequency of the signal coming into the PLL (often $F_{in}=F_{ref}$). T is the division value for the divider receiving $F_{in}$, $F_{out}$ is the output frequency of the VCO of the PLL, and U is the division value for the feedback divider which divides $F_{out}$. The output therefore of the first divider is $F_{out}/T$, and the output of the feedback divider is $F_{out}/U$, and since these signals are fed to the phase detector and the PLL action in lock forces them to be equal, we have $F/T=F_{out}/U$, or equivalently $F_{out}=(U/T)*F_{in}$, which is what I call the design equation. In the case where there is more than one PLL, the design equation of the overall synthesizer system is again an equation relating the output frequency to the input frequency, but now in terms of all the division integers of the several PLLs that make up the synthesizer.

EUCLID'S ALGORITHM: possibly the oldest known algorithm (prior art with a vengencel). It has many uses in various forms, including finding GCD's and LCD's, but as here, it can be used to produce rational fraction approximations to a given ratio. Note that there are several modern version of this alorithm, that are optimized for various kinds of processor or size of input number.

EXT. IN/INT. OUT: stands for "external timebase input" and "internal timebase output". These are signal inputs and outputs that show up in many synthesizer products. They are quite useful in allowing respectively: the use of a higher stability external timebase whose stability, drift, etc is even better than the $F_t$ timebase included with the standalone synthesizer, and the use of an "int. out" signal to synchronize an external device (for example, a counter-timer) to the synthesizers internal timebase. Both these signals and the hardware to switch them in and out and support the feature is very old prior art.

LOCK: When a PLL is locked, I mean: its inputs and outputs are defined by the design equation. Though much prior art (and any number of patents) concern themselves with the details of optimally going from an unlocked state to a locked state, and further, how to optimize the locked state itself, such is not the subject matter of the present invention.

PLL: phase locked loop. Though a PLL can contain as little as a controllable oscillator and a comparison means with no dividers, when I use the term PLL here to refer to a PLL with a reference input, a first programmable divider that divides the reference input, a comparison means with one of its inputs connected to the output of the first divider, a controllable oscillator, a second programmable divider whose input is connected to said oscillator, and whose divided output is connected to the other input of the comparison means, so that the comparison means can provide a correction signal to the controllable oscillator of a strength and polarity to bring the loop into lock. I also include in this term frequency locked loops, hybred phase/freq. locked loops, etc.

int(A) is a math expression meaning "integer value of A", so int(7.41)=7 and int(3/2)=1, etc.

PROGRAMMABLE DIVIDER: this is any device that will divide by a range of integers, and where the division is controllable by the external control and calculation means. It includes binary, decimal, dual and multi-modulus counters, counters within ASIC's, sampling dividers, analog dividers, etc.

STANDARD FREQUENCY: usually 1,5 or 10 MHz—these are the standard frequencies that a typical synthesizer would expect to use as an external reference or to provide as an "int. out" in the 60's, 1 MHz was more popular, but for a long time now 10 MHz has been the most common.

VCXO: Voltage controlled crystal oscillator. This is a controlled oscillator, based on a crystal as the resonant element. It can be used as the controllable oscillator in a PLL. Its characteristics include a very good noise spectrum (almost, but not quite, as quiet as a plain crystal oscillator), but only a very narrow frequency range of oscillation (~50 to perhaps 300 ppM, depending on how badly noise levels are to be impacted).

I claim:

1. An improved method to generate an output frequency $F_{out}$ which is a close approximation of a requested frequency $F_{req}$, in a frequency synthesizer of a type comprising a reference means of frequency $F_{ref}$, two main phase locked loops (PLLs) each with reference paths and feedback paths, a combiner means, and programmable reference dividers dividing by integers $R_1$ and $R_2$ in said two main PLL's reference paths, and programmable feedback dividers dividing by integers $F_1$ and $F_2$, in said two main PLL's feedback paths, said combiner means operatively connected to said two main PLLs, and providing at least one combined signal, and whereby a design equation of said synthesizer comprises simple arithmetical combinations of rational fractions responsive to said integers $R_1$, $R_2$, $F_1$ and $F_2$, said improvement comprising the steps of:

(a) performing at least one set of calculations to produce a plurality of integer pairs $X_1$, $Y_1$ that, taken as a ratio $X_1/Y_1$, are approximations to the ratio $F_{req}/F_{ref}$;

(b) factoring said $Y_1$'s into at least as many factors as there are main PLLs in said synthesizer, and calculating said integers $R_1$ and $R_2$, responsive to said factors;

(c) calculating said integers $F_1$ and $F_2$, responsive to said $X_1$ values of step (a), and said integers $R_1$ and $R_2$, of step (b);

(d) programming said reference dividers with said integers $R_1$ and $R_2$, and programming said feedback dividers with said integers $F_1$ and $F_2$, generating several frequencies in said two main PLLs, combining said frequencies in said combiners, locking said PLLs and thereby producing said $F_{out}$.

2. An improved method for generating an output signal $F_{out}$, having a low noise, adjustable frequency, which is a close approximation to a requested frequency $F_{req}$, in a frequency synthesizer of a type comprising a reference means with signal $F_{ref}$, and a first phase locked loop (PLL) with output $F_1$ locked thereto, and a second PLL with output $F_2$ also locked thereto and a combiner means responsive to said outputs of said first and second PLL's, said combiner means producing a combined signal responsive to $F_1$ and $F_2$, and wherein said output signal $F_{out}$ is responsive to said combined signal, and a calculation and control means, operatively connected to said first and second PLL's, said improvement comprising the steps of:

(a) receiving a request for an output frequency $F_{req}$;

(b) generating a reference signal $F_{ref}$ in said reference means;

(c) calculating a plurality of integer pairs $X_i,Y_i$ that, taken as a ratio $X_i/Y_i$, are approximations to the ratio $F_{req}/F_{ref}$;

(d) factoring said $Y_i$ into two integer factors $M_i$ and $P_i$, whereby $Y_i=M_i*P_i$;

(e) selecting a pair $X_k,Y_k$, from among said plurality of pairs, with the largest value of $Y_k$ wherein each of said integer factors $M_k$, and $P_k$ does not respectively exceed pre-specified maximum values $M_{max}$ and $P_{max}$;

(f) calculating an intermediate pair of integers AA and BB, using diophantine solution methods, said calculation responsive to the equation $X_k=AA*P_k+BB*M_k$ (g) further calculating a subsequent pair of integers $N_k$ and $Q_k$, said subsequent pair also satisfying the equation $X_k=N_k*P_k+Q_k*M_k$, said calculation comprising simple arithmetical manipulation of said equation and said intermediate integers AA and BB;

(h) generating said first signal $F_1$ in a first oscillator in said first PLL, said first oscillator responsive to a first control signal; and generating said second signal $F_2$ in a second oscillator in said second PLL, said second oscillator responsive to a second control signal;

(i) sending said integer $M_k$ to a first programmable divider in said first PLL responsive to said reference signal $F_{ref}$, wherewith to program its divide value, and sending said integer $N_k$ to a second programmable divider in said first PLL responsive to said first PLL output signal $F_1$, wherewith to program its divide value;

(j) dividing a signal responsive to said reference signal $F_{ref}$ by said integer $M_k$ in said first programmable divider, to produce a divided signal responsive to ($F_{ref}/M_k$), and dividing a signal responsive to said signal $F_1$ by said second integer $N_k$ in said second programmable divider, to produce a second divided signal responsive to $F_1/N_k$;

(k) comparing said two divided signals in a first comparison means in said first PLL, to produce said first control signal that is responsive to the difference between the signals responsive to $F_{ref}/M_k$ and $F_1/N_k$ respectively;

(l) controlling said first oscillator by means of said first control signal to cause said first PLL to lock, and whereby $F_1$ is responsive to $(N_k/M_k)*F_{ref}$;

(m) sending said integer $P_k$ to a third programmable divider in said second PLL responsive to said reference signal $F_{ref}$, wherewith to program its divide value, and sending said integer $Q_k$ to a fourth programmable divider in said second PLL responsive to said second signal $F_2$, wherewith to program its divide value;

(n) dividing a signal responsive to said reference signal $F_{refj}$ by said integer $P_k$ in said third programmable divider, to produce a divided signal responsive to ($F_{refj}/P_k$), and dividing a signal responsive to said second PLL output signal $F_2$ by said integer $Q_k$ in said fourth programmable divider, to produce a second divided signal responsive to ($F_2/Q_k$);

(o) comparing said two divided signals in a second comparison means in said second PLL, to produce a second control signal that is responsive to the difference between the signals responsive to $F_{ref}/P_k$ and $F_2/Q_k$ respectively;

(p) controlling said second oscillator by means of said second control signal to cause said second PLL to lock, and whereby $F_2$ is responsive to $(Q_k/P_k)*F_{ref}$;

(q) combining signals responsive to said first and second PLL output signals $F_1$ and $F_2$ in said combiner means to form said output signal $F_{out}$ responsive to $F_1+F_2$, which in turn is responsive to $(N_k/M_k+Q_k/P_k)*F_{ref}$.

3. The method recited in claim 2, wherein step (c) comprises a calculation based on a form of Euclid's Algorithm.

4. The method recited in claim 3, wherein the calculation of said $N_k$ and $Q_k$ further constrains their range of values by use of at least one equation responsive to hardware characteristics of said PLL's.

5. An improved method for generating an output signal $F_{out}$, having a low noise, adjustable frequency, which is a close approximation to a requested frequency $F_{req}$, in a frequency synthesizer of a type comprising an adjustable reference means with signal $F_{refj}$, and a first phase locked loop (PLL) with output $F_1$ locked thereto, and a second PLL with output $F_2$ also locked thereto, and a combiner means responsive to said outputs of said first and second PLL's, said combiner means producing a combined signal responsive to $F_1$ and $F_2$, and wherein said output signal $F_{out}$ is responsive to said combined signal, and a calculation and control means, operatively connected to said first and second PLLs and said adjustable reference, said improvement comprising the steps of:

(a) receiving a request for an output frequency $F_{req}$;

(b) selecting a value $F_{refj}$ within the frequency range of said adjustable reference means;

(c) calculating a plurality of integer pairs $X_1,Y_1$ that, taken as a ratio $X_i/Y_i$, are approximations to the ratio $F_{req}/F_{refj}$;

(d) factoring said $Y_i$ into two integer factors $M_i$ and $P_i$, whereby $Y_i=M_i*P_i$;

(e) selecting a pair $X_k,Y_k$, from among said plurality of pairs, with the largest value of $Y_k$ wherein each of said integer factors $M_k$, and $P_k$ does not respectively exceed pre-specified maximum values $M_{max}$ and $P_{max}$;

(f) calculating a value, responsive to the equation: $err=F_{req}-F_{out}=F_{req}-(X_k/Y_k)*F_{refj}$;

(g) comparing said calculated value to a pre-selected limit value, and upon the condition that said calculated value is larger than said limit, selecting a new value of $F_{refj}$, and repeating steps (b) through (g); and upon the condition that said calculated value is smaller than said limit, proceeding to step (h);

(h) adjusting said adjustable reference means to generate a reference signal of frequency $F_{refj}$, wherein $F_{refj}$ is the reference frequency value in use when step (g) was satisfied:

(i) calculating an intermediate pair of integers AA and BB, using diophantine solution methods, said calculation responsive to the equation $X_k=AA*P_k+BB*M_k$ (j) further calculating a subsequent pair of integers $N_k$ and $Q_k$, said subsequent pair also satisfying the equation $X_k=N_k*P_k+Q_k*M_k$, said calculation comprising simple arithmetical manipulation of said equation and said intermediate integers AA and BB;

(k) generating said first signal $F_1$ in a first oscillator in said first PLL, said first oscillator responsive to a first control signal; and generating said second signal $F_2$ in a second oscillator in said second PLL, said second oscillator responsive to a second control signal;

(l) sending said integer $M_k$ to a first programmable divider in said first PLL responsive to said reference signal $F_{refj}$, wherewith to program its divide value, and sending said integer $N_k$ to a second programmable divider in said first PLL responsive to said first signal $F_1$, wherewith to program its divide value;

(m) dividing a signal responsive to said reference signal $F_{refj}$ by said integer $M_k$ in said first programmable divider, to produce a divided signal responsive to ($F_{refj}/M_k$), and dividing a signal responsive to said signal $F_1$ by said second integer $N_k$ in said second programmable divider, to produce a second divided signal responsive to $F_1/N_k$;

(n) comparing said two divided signals in a first comparison means in said first PLL, to produce said first control signal that is responsive to the difference between the signals responsive to $F_{refj}/M_k$ and $F_1/N_k$ respectively;

(o) controlling said first oscillator by means of said first control signal to cause said first PLL to lock, and whereby $F_1$ is responsive to $(N_k/M_k)*F_{refj}$.

(p) sending said integer $P_k$ to a third programmable divider in said second PLL responsive to said reference signal $F_{refj}$, wherewith to program its divide value, and sending said integer $Q_k$ to a fourth programmable divider in said second PLL responsive to said second signal $F_2$, wherewith to program its divide value;

(q) dividing a signal responsive to said reference signal $F_{refj}$ by said integer $P_k$ in said third programmable divider, to produce a divided signal responsive to $(F_{refj}/P_k)$, and dividing a signal responsive to said second PLL output signal $F_2$ by said integer $Q_k$ in said fourth programmable divider, to produce a second divided signal responsive to $(F_2/Q_k)$;

(r) comparing said two divided signals in a second comparison means in said second PLL, to produce a second control signal that is responsive to the difference between the signals responsive to $F_{refj}/P_k$ and $F_2/Q_k$ respectively;

(s) controlling said second oscillator by means of said second control signal to cause said second PLL to lock, and whereby $F_2$ is responsive to $(Q_k/P_k)*F_{refj}$;

(t) combining said first and second PLL output signals $F_1$ and $F_2$ in said combiner means to form said output signal $F_{out}$ responsive to $F_1$ and $F_2$ which in turn is responsive to $(N_k/M_k+Q_k/P_k)*F_{refj}$.

6. The method recited in claim 5, wherein step (c) comprises a calculation based on a form of Euclid's Algorithm.

7. The method recited in claim 6, wherein the calculation of said $N_k$ and $Q_k$ further constrains their range of values by use of at least one equation responsive to hardware characteristics of said PLL's.

8. The method recited in claim 7, wherein said adjustable reference means comprises more than one stable reference oscillator, oscillating at more than one stable frequency, and a selector means operatively connected to each of said stable oscillators, and wherein:
  step (b) comprises selecting one among said plurality of reference frequencies, and;
  step (h) comprises controlling said selector means to select the corresponding signal from said selected oscillator.

9. The method recited in claim 8 wherein one of said stable reference oscillators oscillates at a standard frequency, and wherein:
  step (b) comprises selecting said standard frequency reference frequency as a first choice, and other of said frequencies as subsequent choices if required by step (g).

10. The method recited in claim 7, wherein said adjustable reference means is a single oscillator, with a variable frequency control, and wherein:
  step (b) comprises selecting a $F_{refj}$ value within the range of said variable frequency control, and;
  step (h) comprises commanding said variable frequency control to cause said adjustable reference means to produce said frequency $F_{refj}$.

11. The method recited in claim 7 wherein said adjustable reference means comprises a PLL including a fixed reference source of a known type, of frequency $F_t$; a fifth programmable divider dividing said signal $F_t$ by an integer $M'$, and producing divided signal $F_t/M'$; a third adjustable oscillator of output frequency $F_{refj}$; a sixth programmable divider dividing said output signal $F_{refj}$ by a second integer $N'$, and producing second divided signal $F_{refj}/N'$; and a comparison means to compare said divided signals $F_t/M'$ and $F_{refj}/N'$ and produce a control signal responsive to the difference therebetween, and therewith to control said third adjustable oscillator to minimize said difference and cause said loop to lock; and a memory means containing at least two pair of precalculated values $M_j$ and $N_j$, a control means to load said pairs into said programmable dividers, and wherein:
  step (b) recited in claim 7 comprises choosing one of said pairs of $M_j$ and $N_j$, thereby choosing a numerical value $F_{refj}=(N_j'/M_j)*F_t$, and;
  step (h) recited in claim 7 comprises causing said control means to load said $M_j$ and $N_j$ values into said fifth and sixth programmable dividers, and whereby after lock, the reference frequency $F_{refj}$ stands to said fixed reference $F_t$ in the relation described by the equation: $F_{refj}=(N_j'/M_j)*F_t$.

12. The method recited in claim 11 wherein said third adjustable oscillator is Voltage Controlled Crystal Oscillator.

13. The method recited in claim 12 wherein said fixed reference source $F_t$ oscillates at a standard frequency, and where said fixed reference source further comprises means to allow an external reference input and a reference output signal responsive to said fixed reference source $F_t$.

14. An improved method for generating an output signal $F_{out}$, having a low noise, adjustable frequency, which is a close approximation to a requested frequency $F_{req}$, in a frequency synthesizer of a type comprising a reference means with signal $F_{ref}$, and a first PLL with output $F_1$ locked thereto, and a second PLL with output $F_2$ also locked thereto, and a combiner means responsive to said outputs of said first and second PLL's, said combiner means producing a combined signal comprising $F_1$ and $F_2$, and wherein at least the first of said PLL's derives a feedback signal responsive to said combined signal, and a calculation and control means, operatively connected to said first and second PLL's, said improvement comprising the steps of:

(a) receiving a request for an output frequency $F_{req}$;
(b) generating a reference signal $F_{ref}$ in said reference means;
(c) calculating a plurality of integer pairs $X_i, Y_i$ that, taken as a ratio $X_i/Y_i$, are approximations to the ratio $F_{req}/F_{ref}$;
(d) factoring said $Y_i$ into two integer factors $M_i$ and $P_i$, whereby $Y_i=M_i*P_i$;
(e) selecting a pair $X_k, Y_k$, from among said plurality of pairs, with the largest value of $Y_k$ wherein each of said integer factors $M_k$, and $P_k$ does not respectively exceed pre-specified maximum values $M_{max}$ and $P_{max}$;
(f) calculating an intermediate pair of integers AA and BB, using diophantine solution methods, said calculation responsive to the equation $X_k=AA*P_k+BB*M_k$
(g) further calculating a subsequent pair of integers $N_k$ and $Q_k$, said subsequent pair also satisfying the equation $X_k=N_k*P_k+Q_k*M_k$, said calculation comprising simple arithmetical manipulation of said equation and said intermediate integers AA and BB;
(h) generating said first signal $F_1$ in a first oscillator in said first PLL, said first oscillator responsive to a first control signal; and generating said second signal $F_2$ in a second oscillator in said second PLL, said second oscillator responsive to a second control signal;

(i) sending said integer $M_k$ to a first programmable divider in said first PLL responsive to said reference signal $F_{ref}$, wherewith to program its divide value, and sending said integer $N_k$ to a second programmable divider in said first PLL responsive to said combined signal $F_1+F_2$, wherewith to program its divide value;

(j) dividing a signal responsive to said reference signal $F_{ref}$ by said integer $M_k$ in said first programmable divider, to produce a divided signal responsive to $(F_{ref}/M_k)$, and dividing a signal responsive to said combined signal $F_1+F_2$ by said second integer $N_k$ in said second programmable divider, to produce a second divided signal responsive to $(F_1+F_2)/N_k$;

(k) comparing said two divided signals in a first comparison means in said first PLL, to produce said first control signal that is responsive to the difference between the signals responsive to $F_{ref}/M_k$ and $(F_1+F_2)/N_k$ respectively;

(l) controlling said first oscillator by means of said first control signal to cause said first PLL to lock, and whereby $(F_1+F_2)$ is responsive to $(N_k/M_k)*F_{ref}$;

(m) sending said integer $P_k$ to a third programmable divider in said second PLL responsive to said reference signal $F_{ref}$, wherewith to program its divide value, and sending said integer $Q_k$ to a fourth programmable divider in said second PLL responsive to said second signal $F_2$, wherewith to program its divide value;

(n) dividing a signal responsive to said reference signal $F_{ref}$ by said integer $P_k$ in said third programmable divider, to produce a divided signal responsive to $(F_{ref}/P_k)$, and dividing a signal responsive to said second PLL output signal $F_2$ by said integer $Q_k$ in said fourth programmable divider, to produce a second divided signal responsive to $(F_2/Q_k)$;

(o) comparing said two divided signals in a second comparison means in said second PLL, to produce a second control signal that is responsive to the difference between the signals responsive to $F_{ref}/P_k$ and $F_2/Q_k$ respectively;

(p) controlling said second oscillator by means of said second control signal to cause said second PLL to lock, and whereby $F_2$ is responsive to $(Q_k/P_k)*F_{ref}$, and where, by step (1), $F_1$ is in turn responsive to $(N_k/M_k + Q_k/P_k)*F_{ref}$.

15. The method recited in claim 14, wherein step (c) comprises a calculation based on a form of Euclid's Algorithm.

16. The method recited in claim 15, wherein the calculation of said $N_k$ and $Q_k$ further constrains their range of values by use of at least one equation responsive to hardware limitations of said PLL's.

17. An improved method for generating an output signal $F_{out}$, having a low noise, adjustable frequency, which is a close approximation to a requested frequency $F_{req}$, in a frequency synthesizer of a type comprising an adjustable reference means with signal $F_{refj}$, and a first PLL with output $F_1$ locked thereto, and a second PLL with output frequency $F_2$ also locked thereto, and a combiner means responsive to the outputs of said first and second PLL's, said combiner means producing a combined signal comprising $F_1$ and $F_2$, and wherein at least the first of said PLL's derives a feedback signal responsive to said combined signal, and a calculation and control means, operatively connected to said first and second PLLs and said adjustable reference, said improvement comprising the steps of:

(a) receiving a request for an output frequency $F_{req}$;

(b) selecting a value $F_{refj}$ within the frequency range of said adjustable reference means;

(c) calculating a plurality of integer pairs $X_1, Y_1$ that, taken as a ratio $X_1/Y_1$, are approximations to the ratio $F_{req}/F_{refj}$;

(d) factoring said $Y_1$ into two integer factors $M_1$ and $P_1$, whereby $Y_1 = M_1*P_1$;

(e) selecting a pair $X_k$, $Y_k$, from among said plurality of pairs, with the largest value of $Y_k$ wherein each of said integer factors $M_k$, and $P_k$ does not respectively exceed pre-specified maximum values $M_{max}$ and $P_{max}$;

(f) calculating a value, responsive to the equation: $err = F_{req} - F_{out} = F_{req} - (X_k/Y_k)*F_{refj}$;

(g) comparing said calculated value to a pre-selected limit value, and upon the condition that said calculated value is larger than said limit, selecting a new value of $F_{refj}$, and repeating steps (b) through (g); and upon the condition that said calculated value is smaller than said limit, proceeding to step (h);

(h) adjusting said adjustable reference means to generate a reference signal of frequency $F_{refj}$, wherein $F_{refj}$ is the reference frequency value in use when step (g) was satisfied; t (i) calculating an intermediate pair of integers AA and BB, using diophantine solution methods, said calculation responsive to the equation $X_k = AA*P_k + BB*M_k$ (j) further calculating a subsequent pair of integers $N_k$ and $Q_k$, said subsequent pair also satisfying the equation $X_k = N_k*P_k + O_k*M_k$, said calculation comprising simple arithmetical manipulation of said equation and said intermediate integers AA and BB;

(k) generating said first signal $F_1$ in a first oscillator in said first PLL, said first oscillator responsive to a first control signal; and generating said second signal $F_2$ in a second oscillator in said second PLL, said second oscillator responsive to a second control signal;

(l) sending said integer $M_k$ to a first programmable divider in said first PLL responsive to said reference signal $F_{refj}$, wherewith to program its divide value, and sending said integer $N_k$ to a second programmable divider in said first PLL responsive to said combined signal $F_1+F_2$, wherewith to program its divide value;

(m) dividing a signal responsive to said reference signal $F_{refj}$ by said integer $M_k$ in said first programmable divider, to produce a divided signal responsive to $(F_{refj}/M_k)$, and dividing a signal responsive to said combined signal $F_1+F_2$ by said second integer $N_k$ in said second programmable divider, to produce a second divided signal responsive to $(F_1+F_2)/N_k$;

(n) comparing said two divided signals in a first comparison means in said first PLL, to produce said first control signal that is responsive to the difference between the signals responsive to $F_{refj}/M_k$ and $(F_1+F_2)/N_k$ respectively;

(o) controlling said first oscillator by means of said first control signal to cause said first PLL to lock, and whereby $(F_1+F_2)$ is responsive to $(N_k/M_k)*F_{refj}$;

(p) sending said integer $P_k$ to a third programmable divider in said second PLL responsive to said reference signal $F_{refj}$, wherewith to program its divider value, and sending said integer $Q_k$ to a fourth programmable divider in said second PLL responsive to said second signal $F_2$, wherewith to program its divide value;

(q) dividing a signal responsive to said reference signal $F_{refj}$ by said integer $P_k$ in said third programmable divider, to produce a divided signal responsive to ($F_{refj}/P_k$), and dividing a signal responsive to said second PLL output signal $F_2$ by said integer $Q_k$ in said fourth programmable divider, to produce a second divided signal responsive to ($F_2/Q_k$);

(r) comparing said two divided signals in a second comparison means in said second PLL, to produce a second control signal that is responsive to the difference between the signals responsive to $F_{refj}/P_k$ and $F_2/Q_k$ respectively;

(s) controlling said second oscillator by means of said second control signal to cause said second PLL to lock, and whereby $F_2$ is responsive to $Q_k/P_k * F_{refj}$, and where, by step (o), $F_1$ is responsive to $(N_k/M_k + Q_k/P_k) * F_{refj}$.

18. The method recited in claim 17, wherein step (c) comprises a calculation based on a form of Euclid's Algorithm.

19. The method recited in claim 18, wherein the calculation of said $N_k$ and $Q_k$ further constrains their range of values by use of at least one equation responsive to hardware limitations of said PLL's.

20. The method recited in claim 19, wherein said adjustable reference means comprises more than one stable reference oscillator, oscillating at more than one stable frequency, and a selector means operatively connected to each of said stable oscillators, and wherein:

step (b) comprises selecting one among said plurality of reference frequencies, and;

step (h) comprises commanding said selector means to select the corresponding signal from said selected oscillator.

21. The method recited in claim 20 wherein one of said stable reference oscillators oscillates at a standard frequency, and wherein:

step (b) comprises selecting said standard frequency reference frequency as a first choice, and other of said frequencies as subsequent choices if required by step (g).

22. The method recited in claim 19, wherein said adjustable reference means is a single oscillator, with a variable frequency control, and wherein:

step (b) comprises selecting a $F_{refj}$ value within the range of said variable frequency control, and;

step (h) comprises commanding said variable frequency control to cause said adjustable reference means to produce said frequency $F_{refj}$.

23. The method recited in claim 19 wherein said adjustable reference means comprises a PLL including a fixed reference source of a known type, of frequency $F_t$; a fifth programmable divider dividing said signal $F_t$ by an integer M', and producing divided signal $F_t/M$; a third adjustable oscillator of output frequency $F_{refj}$; a sixth programmable divider dividing said output signal $F_{refj}$ by a second integer N', and producing second divided signal $F_{refj}/N'$; and a comparison means to compare said divided signals $F_t/M'$ and $F_{refj}/n'$ and produce a control signal responsive to the difference therebetween, and therewith to control said third adjustable oscillator to minimize said difference and cause said loop to lock; and a memory means containing at least two pair of precalculated values $M_j$ and $N_j$, a control means to load said pairs into said programmable dividers, and wherein:

step (b) comprises choosing one of said pairs of $M_{j'}$ and $N_{j'}$, thereby choosing a numerical value $F_{refj} = (N_{j'}/M_{j'}) * F_t$, and;

step (h) comprises causing said control means to load said $M_{j'}$ and $N_{j'}$ values into said fifth and sixth programmable dividers, and whereby after lock, the reference frequency $F_{refj}$ stands to said fixed reference $F_t$ in the relation described by the equation: $F_{refj} = (N_{j'}/M_{j'}) * F_t$.

24. The method recited in claim 23 wherein said third adjustable oscillator is a Voltage Controlled Crystal Oscillator.

25. The method recited in claim 24 wherein said fixed reference source $F_t$ oscillates at a standard frequency, and where said fixed reference source further comprises means to allow an external reference input and a reference output signal responsive to said fixed reference source $F_t$.

* * * * *